United States Patent
Gotch et al.

(10) Patent No.: US 7,962,664 B2
(45) Date of Patent: Jun. 14, 2011

(54) TECHNIQUES FOR GENERATING A TRACE STREAM FOR A DATA PROCESSING APPARATUS

(75) Inventors: Paul Robert Gotch, Cherry Hinton (GB); John Michael Horley, Cambridge (GB)

(73) Assignee: ARM Limited, Cambridge (GB)

( * ) Notice: Subject to any disclaimer, the term of this patent is extended or adjusted under 35 U.S.C. 154(b) by 288 days.

(21) Appl. No.: 12/232,999

(22) Filed: Sep. 26, 2008

(65) Prior Publication Data

US 2009/0089626 A1    Apr. 2, 2009

(30) Foreign Application Priority Data

Sep. 28, 2007  (GB) .................................. 0719043.2

(51) Int. Cl.
*G06F 3/00*        (2006.01)
(52) U.S. Cl. ................. 710/15; 710/16; 710/62; 710/68
(58) Field of Classification Search .......................... None
See application file for complete search history.

(56) References Cited

U.S. PATENT DOCUMENTS

| | | | |
|---|---|---|---|
| 6,918,065 B1 | 7/2005 | Edwards et al. | |
| 7,188,227 B2 * | 3/2007 | Luick ............................ | 711/172 |
| 2002/0178405 A1 | 11/2002 | McCullough et al. | |
| 2004/0103216 A1 * | 5/2004 | Lane ................................ | 709/247 |
| 2007/0298788 A1 * | 12/2007 | Corson et al. ................... | 455/433 |
| 2008/0256396 A1 * | 10/2008 | Giannini et al. ................ | 714/45 |
| 2009/0154545 A1 * | 6/2009 | Fallon et al. .................... | 375/240 |

FOREIGN PATENT DOCUMENTS

| | | |
|---|---|---|
| EP | 0 316 609 | 5/1989 |
| JP | 2002-207245 | 1/1999 |

OTHER PUBLICATIONS

Crowley et al., Dynamic Compression During System Save Operatiosn, May 1, 1994, IBM Technical Disclosure Bulletin, pp. 1-3.*
Search Report for GB 0719043.2 dated Jan. 11, 2008.

* cited by examiner

*Primary Examiner* — Eron J Sorrell
(74) *Attorney, Agent, or Firm* — Nixon & Vanderhye P.C.

(57) ABSTRACT

Trace circuitry, and a method of operating such trace circuitry, are provided for generating a trace stream indicative of activities of monitored circuitry of a data processing apparatus. The monitored circuitry produces data elements indicative of those activities, and the trace circuitry comprises trace element generation circuitry which is responsive to at least some of the data elements produced by the monitored circuitry to generate trace elements representative of those data-elements, with the trace elements generated being dependent on a selected trace mode of operation of the trace circuitry. Compression circuitry is then arranged to apply an encoding operation to a sequence of trace elements in order to produce a packet whose bit pattern represents the sequence of trace elements, and to cause that packet to be output in the trace stream, the encoding operation applied being dependent on a current compression scheme associated with the compression circuitry. Whilst in the selected trace mode of operation, the compression circuitry is responsive to a compression change stimulus to change the current compression scheme from a first compression scheme to a second compression scheme whose bit pattern encoding space overlaps the bit pattern encoding space of the first compression scheme, such that following the change of compression scheme any further packets produced whilst in the selected trace mode of operation are produced in accordance with the second compression scheme. Such an approach has been found to provide improved compression efficiency thereby reducing the volume of trace data produced.

19 Claims, 14 Drawing Sheets

TECHNIQUES FOR GENERATING A TRACE STREAM FOR A DATA PROCESSING APPARATUS

BACKGROUND OF THE INVENTION

1. Field of the Invention

The present invention relates to techniques for generating a trace stream indicative of activities of monitored circuitry of a data processing apparatus.

2. Background of the Invention

Tracing the activity of a data processing system whereby a stream of trace elements is generated including data representing the step-by-step activity within the system is a highly useful tool in system development. However, with the general move towards more deeply embedded processor cores, it becomes more difficult to track the activities of the processor core or other on-chip devices via externally accessible pins. Accordingly, as well as off-chip tracing mechanisms for capturing and analyzing trace data, increased amounts of tracing functionality are being placed on-chip. An example of such on-chip tracing mechanisms is the Embedded Trace Macrocell (ETM) provided by ARM Limited, Cambridge, England, in association with a variety of their ARM processors.

Such tracing mechanisms produce in real-time a trace stream providing trace elements representing activities of the data processing apparatus that are desired to be traced. This trace stream can then subsequently be analyzed for a variety of purposes, for example to facilitate debugging of sequences of processing instructions being executed by the data processing apparatus, for performing profiling operations in order to determine the performance of particular program code being executed on the data processing apparatus, etc.

Typically, the stream of trace elements that is generated by the trace mechanism is buffered prior to output for subsequent analysis. Such a trace buffer is able to store a finite amount of information and requires a dedicated data bus which has a finite bandwidth over which the elements to be buffered can be received. The trace buffer is generally arranged to store information in a wrap-around manner, i.e. once the trace buffer is full, new data is typically arranged to overwrite the oldest data stored therein. It has been found that the bandwidth of the dedicated data bus limits the rate at which information can be stored in the trace buffer.

Typically, a trace analyzing tool is provided which receives the trace stream of trace elements from the trace buffer when desired, for example once the trace has completed. The trace analyzing tool can then be used to reconstruct the activities of the device being traced based on the received trace elements. As devices such as processor cores increase in power and complexity, it is clear that the amount of information required to track the activities of such devices will increase, and accordingly there will potentially be a very large volume of trace elements that need to be traced.

However, there is a problem that there is finite bus bandwidth over which the trace elements can be output by the trace logic, and any trace buffer used to buffer such trace elements will have a finite size. Accordingly, the volume of trace elements that can be generated is limited.

The activities of a device that it might be desirable to trace include, but are not limited to, the instructions being executed by a processor core (referred to as instruction trace), and the memory accesses made by those instructions (referred to as data trace). These activities may be individually traced or traced together, so that the data trace can be correlated with the instruction trace. The data trace itself consists of two parts, the memory addresses and the data values, referred to (respectively) as data address and data value trace. Again, the existing trace ETM protocols allow for data address and data value tracing to be enabled independently or simultaneously.

To reduce the volume of trace data that needs to be output in the trace stream, it is known to subject the trace elements to compression techniques prior to output in the trace stream. In particular, sequences of trace elements can be subjected to an encoding operation in order to produce a packet whose bit pattern represents that sequence of trace elements, with the packet then being output in the trace stream. A compression scheme will typically be defined providing a number of different encoding formats that can be used to encode the trace elements. As an example, each packet output will typically consist of a header portion and an optional payload portion. Considering the headers, these typically take the form of a byte of information, and accordingly there are 256 possible encodings of header. Some of those encodings may be associated with one encoding format, whilst others of those encodings may be associated with different encoding formats. Further encoding formats may be provided for the payload portions. These different encoding formats may be used to encode the different types of trace element that need to be encoded into packets, but these different encoding formats will be non-overlapping in the bit pattern encoding space so as to enable each packet to be uniquely identified by the trace analysing tool used to analyse the trace stream.

By way of example, the existing ETM protocols produce trace elements called atoms which indicate whether instructions have been executed or not, an E atom indicating that an instruction has been executed and an N atom indicating that an instruction has not been executed. Sequences of these atoms can be compressed into packets known as p-headers, a p-header consisting of a byte size header and no payload. One or more encoding formats may be provided for producing p-headers for particular sequences of E and N atoms but each such encoding format will occupy a non-overlapping bit pattern encoding space with respect to any other encoding formats used for p-headers, and indeed in respect of any other encoding formats used for different types of headers, for example branch headers used to identify packets giving information about branch instructions, data address or data value headers used to identify packets containing data address or data value information, etc.

The compression scheme used in association with any particular trace circuitry will typically be fixed at design time, with the particular encoding formats provided in that compression scheme having been chosen based on expected patterns of trace elements which will need to be compressed. Hence, by way of example, considering the earlier-mentioned p-headers, the encoding formats used to produce those p-headers from the sequences of E and N atoms typically use run length encoding schemes where the encoding skews towards long sequences of E atoms since these are typically more common than N atoms.

In addition to being able to selectively enable instruction trace, data address trace, and data value trace, current trace circuitry can also support different trace modes of operation. For example, considering the earlier-mentioned ETM product, a non-cycle accurate trace mode of operation and a cycle accurate trace mode of operation can be provided. To switch from the non-cycle accurate trace mode of operation to the cycle accurate trace mode of operation, or vice versa, any current tracing activity is halted, and a number of the control registers in the trace circuitry are updated to define the new trace mode of operation. As part of that update process, the compression scheme may be changed, to provide a compression scheme better optimised for the new trace mode of operation. For example, considering a cycle accurate trace mode of operation, additional atoms known as W atoms are produced on each clock cycle to provide the cycle accurate timing information, and accordingly the encoding formats used for p-headers in a cycle accurate trace mode of operation are typically different to the encoding formats that would be used in a non-cycle accurate trace mode of operation, to reflect the need to encode sequences of W atoms in the p-headers in addition to E and N atoms. However, again, any compression scheme developed for the cycle accurate trace mode of operation will typically be fixed at design time taking into account expected patterns of trace elements that need to be compressed.

However, within any particular trace mode of operation, efficiency problems can arise when applying the predetermined compression scheme provided for that trace mode of operation. For example, as the complexity and capabilities of the monitored circuitry whose activities are being traced increases, there can be significant variations in the code sequences being executed. Considering again the subject of p-headers, the ARM Thumb-2 instruction set provides an "if then" instruction, which it is found may significantly vary the frequency of N atoms produced, and adversely impact the efficiency of any encoding formats provided for p-headers. As another example, the trace circuitry can be adapted so as not merely to trace all instructions, but instead to only trace particular types of instructions such as branch instructions. When only tracing branch instructions a much higher distribution of N atoms can occur, again adversely affecting compression efficiency.

As mentioned earlier, the volume of trace produced is a significant problem, and any inefficiency in the encodings provided by the compression scheme will increase the volume of the trace stream, and hence require more area for on-chip buffering, more hardware for off-chip capture and/or more pins for off-chip real-time trace capture. Accordingly, it would be desirable to provide an improved technique for compressing trace elements prior to output of a trace stream.

SUMMARY OF THE INVENTION

Viewed from a first aspect, the present invention provides trace circuitry for generating a trace stream indicative of activities of monitored circuitry of a data processing apparatus, the monitored circuitry producing data elements indicative of said activities, and the trace circuitry comprising: trace element generation circuitry responsive to at least some of the data elements produced by the monitored circuitry to generate trace elements representative of those at least some of the data elements, the trace elements generated being dependent on a selected trace mode of operation of the trace circuitry; and compression circuitry for applying an encoding operation to a sequence of trace elements to produce a packet whose bit pattern represents the sequence of trace elements, and to cause that packet to be output in the trace stream, the encoding operation applied being dependent on a current compression scheme associated with the compression circuitry; whilst in the selected trace mode of operation, the compression circuitry being responsive to a compression change stimulus to change the current compression scheme from a first compression scheme to a second compression scheme whose bit pattern encoding space overlaps the bit pattern encoding space of the first compression scheme, such that following the change of compression scheme any further packets produced whilst in said selected trace mode of operation are produced in accordance with the second compression scheme.

In accordance with the present invention, the compression circuitry is arranged to be responsive to a compression change stimulus to change the current compression scheme whilst the trace circuitry is still in a selected trace mode of operation. In particular, the compression change stimulus causes the current compression scheme to be changed from a first compression scheme to a second compression scheme whose bit pattern encoding space overlaps the bit pattern encoding space of the first compression scheme. This occurs even though the trace circuitry is still in the selected trace mode of operation, and accordingly there is no change in the types of trace elements actually being generated by the trace circuitry. Following the change of compression scheme, any further packets produced whilst in the selected trace mode of operation are produced in accordance with the second compression scheme.

By use of the present invention, the meaning associated with particular bit patterns of packets in the trace stream can be changed whilst still in the same trace mode of operation due to the ability to change the compression scheme used whilst in that trace mode of operation. This enables a significant improvement in the compression efficiency to be achieved by enabling the compression scheme applied by the compression circuitry to be adapted, for example having regards to the particular patterns of trace element being output by the monitored circuitry.

In some embodiments, a switch from the first compression scheme to the second compression scheme can take place without halting the trace operation of the trace circuitry, whilst in other embodiments the tracing activity of the trace circuitry will be temporarily halted whilst the change in compression scheme takes place.

The data elements received by the trace circuitry can take a variety of forms provided they give sufficient information for the required trace stream to be generated from them. Further, the data elements may be transmitted from the monitored circuitry (also referred to herein as the traced device) to the trace circuitry, or alternatively may be retrieved by the trace circuitry from that traced device. As an example, the data elements may comprise instruction address values, data address values, or data values. The trace elements produced by the trace element generation circuitry are then typically arranged to contain sufficient information to enable those data elements, or at least the underlying activities of the monitored circuit indicated by those data elements, to be later determined by trace analysing logic analysing the trace stream.

There are a number of ways in which the compression change stimulus may be generated. In one embodiment, the trace circuitry further comprises compression scheme select circuitry for applying predetermined criteria to determine when to change the current compression scheme and upon said determination to cause the compression change stimulus to be produced. Accordingly, in such embodiments, the compression change stimulus is generated internally by the trace circuitry based on an analysis performed by the compression scheme select circuitry.

There are a number of different ways in which the compression scheme select circuitry may determine when to change the current compression scheme. For example, it may be arranged to compare the volume of trace data produced by different compression schemes from the data elements produced by the monitored circuitry, and then select a compression scheme that is considered to be the most efficient based on that analysis. Alternatively, or in addition, it may be responsive to one or more attributes of the activities of the monitored circuitry, such as a value held in a thread identification register indicating a current thread of execution within the monitored circuitry, or an indication of the memory address regions being accessed by the monitored circuitry, in order to decide when to switch compression schemes. As an example, from such information it may be determined which applications are being run by the monitored circuitry, and the compression scheme select circuitry may associate different compression schemes with different applications.

As another example of how the compression scheme select circuitry may determine when to change the current compression scheme, it may be responsive to hint signals received from the monitored circuitry which can be taken into account when determining when to change the compression scheme. Hence, the monitored circuitry may output a hint signal when the activities it is performing are significantly changed, such hint signals either explicitly identifying a compression scheme which the monitored circuitry believes would be most appropriate moving forward, or at least indicating to the compression scheme select circuitry that it is an appropriate time to re-evaluate the compression scheme being used.

The manner in which the compression scheme select circuitry operates may vary dependent on the construction of the compression circuitry of the trace circuitry. In one embodiment, the compression circuitry comprises a plurality of compression elements, each compression element implementing a different compression scheme and being capable of performing said encoding operation; said compression scheme select circuitry is arranged to produce a select signal to select one of said compression elements as the compression element whose compression scheme is the current compression scheme, such that that selected compression element produces packets for inclusion in the trace stream; and the compression scheme select circuitry being arranged to generate said compression change stimulus by altering the select signal.

In accordance with the above embodiment, the compression circuitry is able to support a predetermined number of different compression schemes as dictated by the plurality of compression elements provided within the compression circuitry, and the compression scheme select circuitry produces a select signal to indicate which compression element should be used to produce packets for inclusion in the trace stream at any particular point in time.

It will be appreciated that the compression elements within the compression circuitry may either be entirely separate physical circuits, or alternatively the compression elements may share at least some logic with each other (and in some embodiments may share a significant portion of the logic making up those compression elements). As an example, the different compression elements may provide different encoding formats for encoding p-headers with the encoding formats provided by one compression element having an overlapped bit pattern encoding space to the encoding formats provided by another compression element. However, those compression elements may both employ the same encoding formats when encoding headers other than p-headers, or when encoding payload data associated with headers, and accordingly may share the same logic for performing such non p-header encoding.

In one embodiment, during at least a test period of operation each of the compression elements is arranged to perform the encoding operation with the produced packets being received by the compression scheme select circuitry, the compression scheme select circuitry performing an analysis operation on the produced packets to determine which of said compression elements to select via the select signal. The compression elements may be arranged to execute in parallel to perform their respective encoding operations on the same source data, namely the trace elements produced by the trace element generation circuitry, or alternatively each compression element may be selected sequentially to perform the encoding operation for a predetermined period of time, with the produced packets then being analysed by the compression scheme select circuitry. The test period of operation may be performed periodically so as to re-evaluate the best compression scheme to use on a periodic basis, or alternatively the test period of operation may be triggered by certain information received by the compression scheme select circuitry, for example indications of certain activities being performed by the monitored circuitry, hint signals, etc. In an alternative embodiment, the compression scheme select circuitry may be arranged to continuously perform the analysis operation during the generation of the trace stream so as to enable a switch in compression scheme to take place at any point in time where the compression scheme select circuitry determines that there is a need to change the current compression scheme in order to improve compression efficiency.

As an alternative to providing compression circuitry with a plurality of compression elements, the compression circuitry may be arranged to be a re-configurable circuit. In such embodiments, the compression change stimulus when issued comprises information used to reconfigure the reconfigurable circuit so as to implement the second compression scheme. Such an approach provides further flexibility with regard to the choice of compression scheme.

In one particular embodiment, the compression circuitry comprises duplicate reconfigurable circuits, such that one of the reconfigurable circuits configured to implement the first compression scheme is arranged to continue operation following receipt of the compression-change stimulus whilst the other of the reconfigurable circuits is reconfigured in accordance with the compression change stimulus, following such reconfiguration the other of the reconfigurable circuits then being used to produce subsequent packets in accordance with the second compression scheme. By such an approach, the generation of trace data need not be interrupted by the change of compression scheme, with the switch of compression scheme taking place once the other re-configurable circuit has been reconfigured.

The re-configurable circuit can take a variety of forms, but in one embodiment is a programmable logic device and the compression change stimulus is stored in a memory device used to reprogram the programmable logic device. In one particular embodiment, the programmable logic device may be a field programmable gate array (FPGA) device and the compression change stimulus may be stored in a flash memory device used to reprogram the FPGA device.

The compression change stimulus may be provided to the compression circuitry in a variety of ways. In one embodiment, the trace circuitry further comprises a control register having a compression specifying field for storing the compression change stimulus, the compression circuitry referencing the compression specifying field of the control register to determine when to change the current compression scheme. Hence, the particular value or values stored in the compression specifying field dictate which compression scheme is applied by the compression circuitry at any point in time.

To enable a trace analysing tool to correctly interpret the various packets in the trace stream, the trace analysing tool needs to know when the compression scheme has been changed. There are a number of ways in which the trace analysing tool can be appraised of such a change, and indeed in some embodiments the user of the trace analysing tool may instigate the change in compression scheme and hence will know when the change takes place. In one embodiment when the current compression scheme is changed, the compression circuitry is arranged to output a change signal in the trace stream to indicate that the change has been made, so that a trace analysing apparatus used to analyse the trace stream can determine when the compression scheme has changed so as to correctly interpret the packets in the trace stream. The change signal will provide sufficient information to enable the trace analysing tool to determine which compression scheme has been used in association with packets following that change signal in the trace stream.

Viewed from a second aspect, the present invention provides a data processing apparatus comprising: monitored circuitry for producing data elements indicative of activities of the monitored circuitry; and trace circuitry in accordance with the first aspect of the present invention for generating a trace stream indicative of said activities of the monitored circuitry.

Viewed from a third aspect, the present invention provides a trace analysing apparatus for analysing a trace stream generated by trace circuitry in accordance with the first aspect of the present invention, comprising: packet decompression logic for decoding the packets in the trace stream in order to determine the sequence of trace elements represented by each said packet; and compression scheme select logic for receiving the trace stream and the trace elements determined by the packet decompression logic and applying predetermined criteria to determine when to change the current compression scheme and upon said determination to produce the compression change stimulus.

The compression scheme select logic within the trace analysing apparatus may be provided instead of compression scheme select circuitry within the trace circuitry, and perform a similar analysis to that performed by the compression scheme select circuitry in order to determine when to change the compression scheme. In an alternative embodiment, the trace analysing apparatus may include compression scheme select logic and the trace circuitry may additionally include compression scheme select circuitry, and in such embodiments it will typically be necessary to provide some arbitration mechanism to arbitrate between conflicting changes indicated by these elements. Purely by way of example, the compression scheme select logic within the trace analysing apparatus could in such instances provide a second level of review with regard to the actions taken by the compression scheme select circuitry within the trace circuitry. For example, the compression scheme select logic could be arranged so that it only intervenes in the decisions made by the compression scheme select circuitry in certain situations, and in the event that the compression scheme select logic then does issue compression change stimulus, the arbitration mechanism would give priority to that compression change stimulus as output by the compression scheme select logic.

In one embodiment, the compression circuitry of the trace logic supports a predetermined number of compression schemes; said compression scheme select logic is arranged to produce a select signal to identify which compression scheme is the current compression scheme; and said compression scheme select logic is arranged to generate said compression change stimulus by altering the select signal.

In an alternative embodiment, the compression change stimulus includes information defining the second compression scheme to be used as the current compression scheme. Such an embodiment may be used for example where the compression circuitry within the trace circuitry is reconfigurable.

In one embodiment, the compression scheme select logic references a program image when applying said predetermined criteria to determine whether to change the current compression scheme. A trace analysing apparatus is often provided with a copy of the program image to enable it to reconstruct from the trace elements provided in the trace stream the actual sequence of instructions that were executed by the monitored circuitry. The compression scheme select logic can be arranged to reference the program image so that, for example, when it has identified from analysis of a portion of the trace stream that a change in compression scheme may be worthwhile, it can then study the program image to check that similar patterns of trace elements are likely to be observed in other portions of the code, to thereby confirm that such a change is likely to be worthwhile.

Viewed from a fourth aspect, the present invention provides a method of changing a compression scheme applied by trace circuitry used to generate a trace stream indicative of activities of monitored circuitry of a data processing apparatus, the monitored circuitry producing data elements indicative of said activities, and the method comprising the steps of: responsive to at least some of the data elements produced by the monitored circuitry, generating trace elements representative of those at least some of the data elements, the trace elements generated being dependent on a selected trace mode of operation of the trace circuitry; and applying an encoding operation to a sequence of trace elements to produce a packet whose bit pattern represents the sequence of trace elements, and outputting that packet in the trace stream, the encoding operation applied being dependent on a current compression scheme; whilst in the selected trace mode of operation, in response to a compression change stimulus changing the current compression scheme from a first compression scheme to a second compression scheme whose bit pattern encoding space overlaps the bit pattern encoding space of the first compression scheme, such that following the change of compression scheme any further packets produced whilst in said selected trace mode of operation are produced in accordance with the second compression scheme.

Viewed from a fifth aspect, the present invention provides a computer program product comprising a computer program for causing a computer to analyse a stream of trace elements generated in accordance with the fourth aspect of the present invention by performing the steps of: decoding the packets in the trace stream in order to determine the sequence of trace elements represented by each said packet; and with reference to the trace stream and the trace elements decoded from the packets of the trace stream, applying predetermined criteria to determine when to change the current compression scheme and upon said determination to produce the compression change stimulus.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
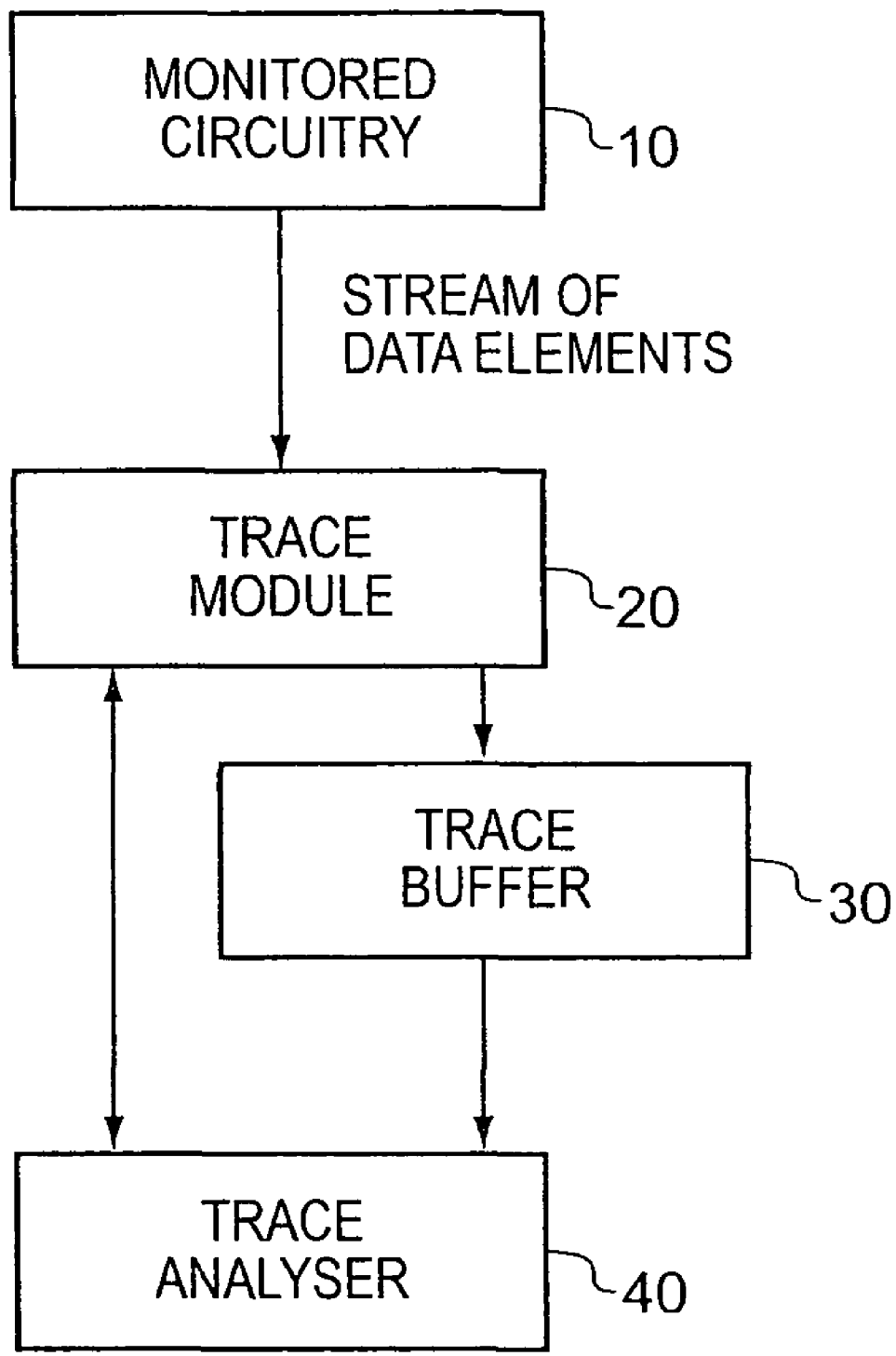
FIG. 1 is a block diagram of a data processing system in accordance with one embodiment of the present invention.

FIG. 1 schematically illustrates a data processing system providing monitored circuitry 10, a trace module 20, a trace buffer 30 and a trace analyser 40. Whilst FIG. 1 illustrates a data processing system providing a trace buffer 30, in alternative embodiments the trace module 20 may pass its output straight to the trace analyser 40, without going via a trace buffer.

The monitored circuitry 10 producing the stream of data elements received by the trace module 20 can take a variety of forms, and may for example be a processor core, a Direct Memory Access (DMA) engine, a data engine/accelerator, etc. Alternatively, the monitored circuitry 10 may consist of a plurality of devices coupled by a bus, and the data elements may be monitored by the trace module 20 as they pass over the bus.

The trace analyser 40, which may in one embodiment be formed by a general purpose computer running appropriate software, is coupled to the trace module 20 and the trace buffer 30. The trace module 20, typically embodied on-chip, is arranged to receive data elements from logic 10 and dependent thereon produces a trace stream providing trace elements which are stored in the trace buffer 30 (which may be provided on or off chip). The trace analyser 40, typically embodied off-chip, is then used to analyse that trace stream in order to derive information indicative of the activities of the monitored circuitry being traced 10. In particular, through analysis of the trace stream, the detailed activity of the monitored circuitry 10 can be determined.

The trace analyser 40 is connected to the trace module 20 to enable certain features of the trace module to be controlled by the user of the trace analyser. Additionally, in some embodiments, the trace stream produced by the trace module 20 may be provided directly to the trace analyser 40 rather than being buffered in the trace buffer 30.

Figure 2:
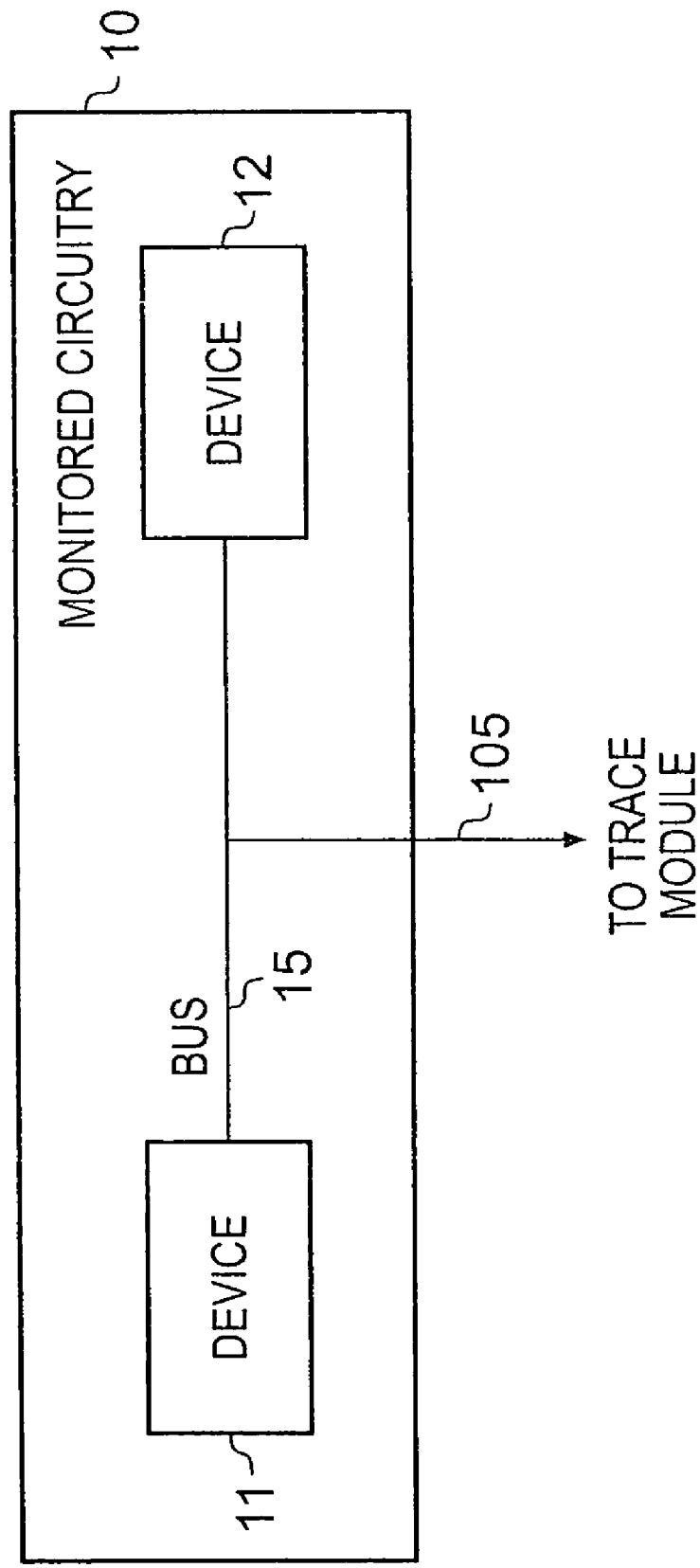
FIG. 2 is a block diagram illustrating an example of the monitored circuitry of FIG. 1 in accordance with one embodiment.

FIG. 2 is a block diagram of an example of the monitored circuitry 10 of FIG. 1. In this example the monitored circuitry 10 comprises two devices (11, 12) connected by a bus 15. The bus is linked to the trace module 20, via connection 105, over which data elements produced by the logic are passed.

Figure 3:
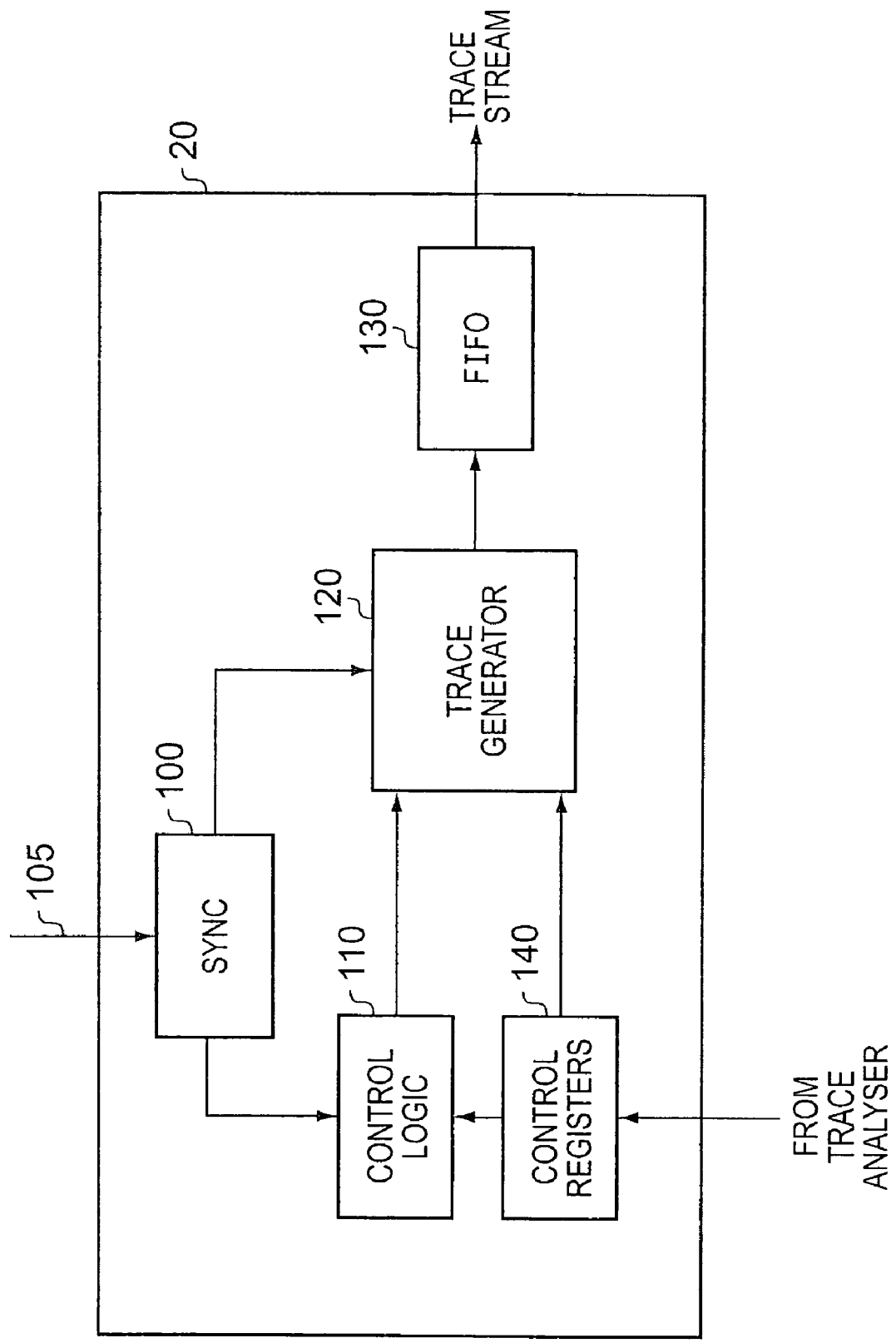
FIG. 3 is a block diagram illustrating in more detail the on-chip trace module of FIG. 1 in accordance with one embodiment.

FIG. 3 is a block diagram of the trace module 20 in accordance with one embodiment. The trace module 20 is arranged to receive over path 105 data elements indicative of the state or operation of the monitored circuitry being traced. The sync logic 100 is arranged to convert the incoming signals into internal versions of the signals more appropriate for use within the trace module 20. These internal versions are then sent to the control logic 110 and the trace generation logic 120, although it will be appreciated that the control logic 110 and the trace generation 120 will not necessarily need to receive the same signals. Fundamentally, the control logic 110 needs to receive data relating to triggerable events, for example instruction addresses, data values, register accesses, etc so that it can determine whether trace should be activated, and what types of data elements should be traced. It then issues appropriate control signals to the trace generation logic 120 to cause the required trace elements to be generated by the trace generation logic 120. The trace generation logic 120 receives via the sync logic 100 any data that would need to be traced dependent on the control signals issued by the control logic 110.

In accordance with embodiments of the present invention, control registers 140 are provided which are used to configure the operation of the control logic 110, these control registers 140 being settable from the trace analyser 40. A number of control registers can be provided, which fundamentally direct two elements of the trace generation logic operation— "when" to generate trace elements, e.g. when a particular range of addresses is accessed, and "what" to generate those trace elements for, e.g. the data address and/or data value of a particular transfer and, typically, supplementary information about the transfer such as whether it is a read or a write operation, whether it is locked, security information etc.

Triggered by a control signal issued by the control logic 110 that a "when" condition is met, the trace generation logic 120 generates the required trace elements indicative of the data elements it is receiving from the sync logic 100, in accordance with the associated "what" signal it also receives from the control logic. These generated trace elements are then typically subjected to a compression operation and then output to the FIFO 130. From here, the trace stream is then output to the trace buffer 30, or in alternative embodiments is output directly to the trace analyser 40.

More details of the compression operation performed by the trace generator 120 in accordance with various different embodiments of the present invention will be provided below, but generally speaking the trace generator of embodiments of the present invention is provided with compression circuitry for applying an encoding operation to a sequence of trace elements in order to produce packets for output in the trace stream, with the encoding operation applied being dependent on a current compression scheme associated with the compression circuitry. The trace generator 120 is responsive to compression change stimulus to change the current compression scheme from a first compression scheme to a second compression scheme whose bit pattern encoding space overlaps the bit pattern encoding space of the first compression scheme, such that following the change of compression scheme any further packets produced whilst in the same trace mode of operation are produced in accordance with the second compression scheme. The compression change stimulus may be generated internally within the trace module 20 by some compression analysis circuitry, or alternatively may be provided from an external source, such as the trace analysing tool 40 based on compression analysis performed therein.

In one embodiment of the present invention, two different trace modes of operation are provided within the trace module 20, namely a non-cycle accurate trace mode of operation and a cycle accurate trace mode of operation. Within either mode of operation, it is possible to output a trace stream including instruction trace and/or data trace and the compression circuitry has associated therewith a compression scheme providing encoding formats for encoding the various trace elements that need to be output in the trace stream. Within a particular compression scheme, the various encoding formats supported are non-overlapping in bit pattern encoding space, so that from any particular pattern of bits, the trace analysing tool can uniquely identify what trace elements are represented by that pattern of bits. Up until now, for a chosen trace mode of operation, the compression scheme applied by the compression circuitry of the trace module 20 has been predetermined and fixed. Whilst such an approach can operate satisfactorily in many situations, it is becoming more and more commonplace for the activities of the monitored circuitry to vary significantly enough that in some situations the effectiveness of the compression is compromised. As the volume of trace data is a significant problem in modern day systems including on-chip tracing mechanisms, embodiments of the present invention which provide a mechanism for altering the compression scheme whilst still in a particular trace mode of operation, i.e. while the same basic types of trace element are being produced, can give rise to significant improvements in compression efficiency thereby reducing the overall volume of trace data produced. Particular embodiments of the present invention will now be described in more detail below.

Figure 4:
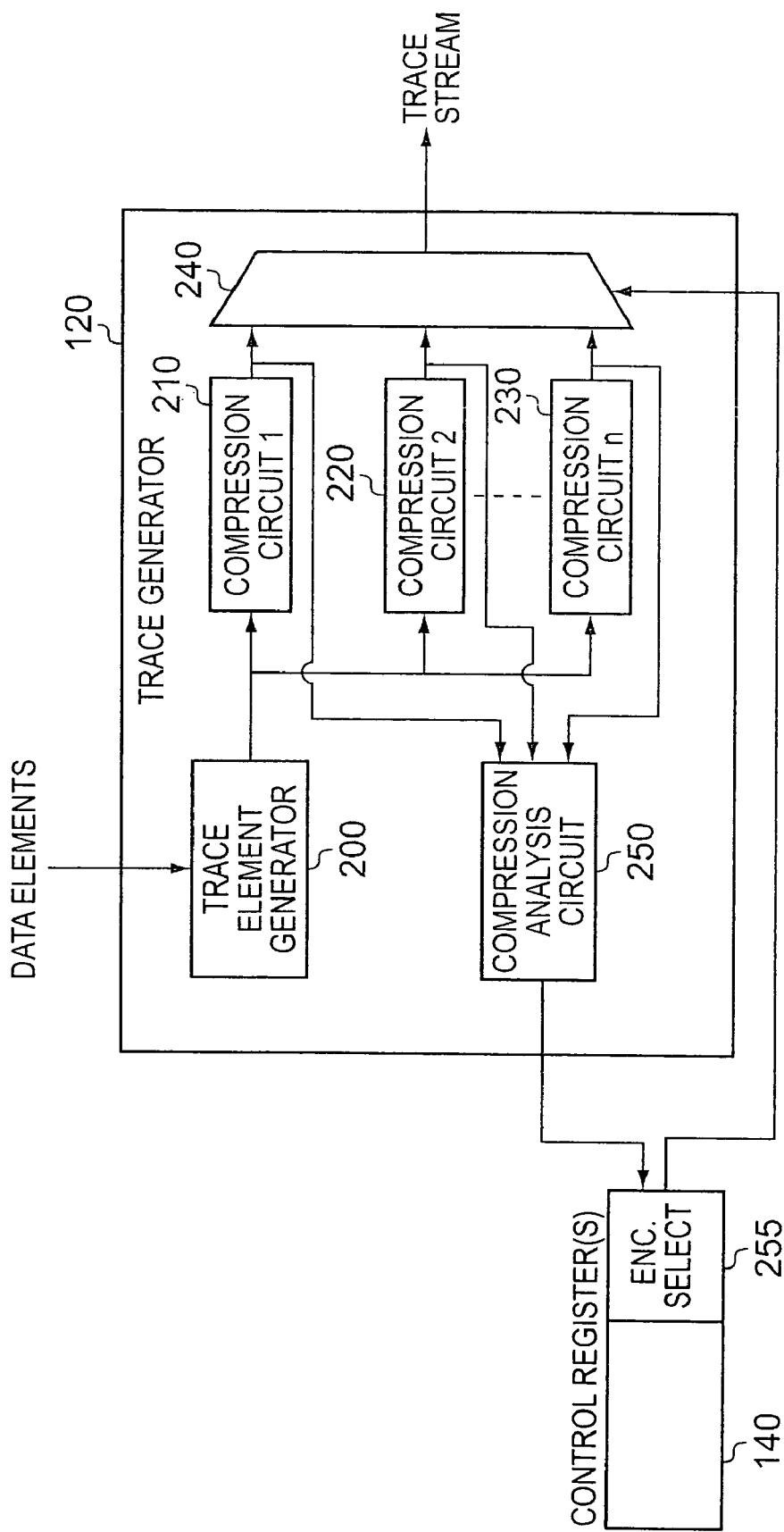
FIG. 4 is a block diagram illustrating the trace generator of FIG. 3 in accordance with one embodiment of the present invention.

FIG. 4 illustrates the trace generator 120 of FIG. 3 in accordance with a particular embodiment of the present invention, where compression circuitry within the trace generator consists of a plurality of compression circuits 210, 220, 230. As shown in FIG. 4, any of the data elements produced by the monitored circuitry that are to have trace elements generated in respect thereof are forwarded from the sync circuitry 100 to trace element generation circuitry 200 within the trace generator 120, the trace element generator then generating in a known manner a stream of trace elements. This stream of trace elements is then provided to compression circuitry which in the embodiment illustrated in FIG. 4 consists of n compression circuits 210, 220, 230. These compression circuits are arranged to employ different compression schemes and at any particular point in time the output from one of the compression circuits is chosen via multiplexer 240 to produce a trace stream of packets output from the trace generator 120 to the FIFO 1-30. Whilst all of the compression circuits could in one embodiment be run in parallel, it will typically be the case that in normal operation only one of the compression circuits will be active so as to avoid unnecessary power consumption.

Also provided within the trace generator 120 is compression analysis circuitry 250 which at least during a test period of operation can receive the outputs from the various compression circuits and compare them in order to determine which compression circuit is producing the most efficient compression. During such a test period of operation, the compression circuits 210, 220, 230 may be arranged to operate in parallel on the same raw trace element stream produced by the trace element generator 200, with the outputs from those circuits then being routed back to the compression analysis circuit 250. During this period, one of the compression circuits can be selected as the active compression circuit whose output is actually forming the trace stream, with the multiplexer 240 selecting that compression circuit's output. As an alternative, during the test period of operation, each of the compression circuits 210, 220, 230 may be selected in turn to perform compression for a predetermined period of time, again with the results being collated within the compression analysis circuit 250. When each of the compression circuits has been used for a period of time, the compression analysis circuit 250 can then compare the results achieved from the various compression circuits and based thereon select the most appropriate compression circuit to be used for future packets produced by the trace generator 120.

It will be appreciated that the actual comparison performed within the compression analysis circuit based on the results produced by the various compression circuits can take a variety of forms. However, in one embodiment, the compression analysis circuit retains for each compression circuit a trace data count identifying the number of bytes of compressed trace data output from the various compression circuit, so as to enable the compression analysis circuit to then select the compression circuit that produced the least number of bytes of output trace data during the test period of operation.

Once the compression analysis circuit has performed its analysis, it outputs a signal to identify the compression circuit which has been selected for performing the compression of subsequent trace elements output by the trace element generator 200. This output may be forwarded directly to the relevant compression circuit and/or the multiplexer 240, or alternatively as shown in FIG. 4 may take the form of a select signal stored within an encoding select field 255 (also referred to herein as a compression specifying field) of the control register(s) 140. Whilst such an encoding select field 255 may be provided within the control registers 140, it will be appreciated that there is no need for that field to be physically one of the control registers 140, and instead the select signal may be stored in any appropriate storage location accessible to the trace generator 120.

Figure 5:
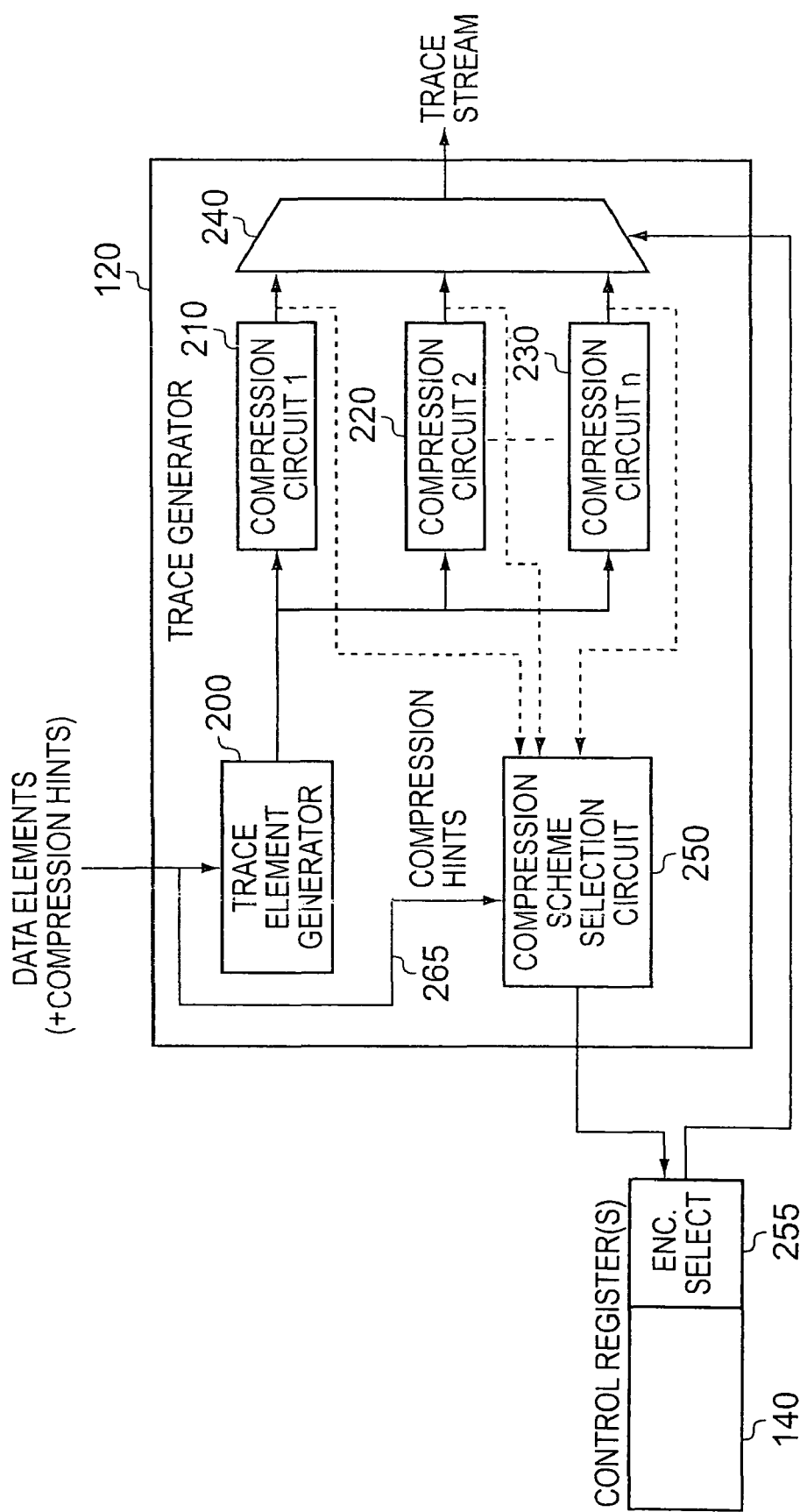
FIG. 5 is a block diagram illustrating the trace generator of FIG. 3 in accordance with an alternative embodiment of the present invention.

FIG. 5 illustrates an alternative embodiment of the present invention where the compression analysis circuit 250 can receive additional information used to enable selection of the appropriate compression circuit. Indeed, in this embodiment the compression analysis circuit 250 is referred to as a compression scheme selection circuit 250, since optionally it may be driven directly by this additional information rather than using the results output by any particular compression circuit. However, as illustrated by the dotted lines from the output of the compression circuits back to the compression scheme selection circuit 250, in one embodiment the compression scheme selection circuit still refers to the compression results achieved by the various compression circuits when determining the appropriate compression circuit to select.

However, as shown in FIG. 5, the compression scheme selection circuit 250 also receives additional signals over path 265, and in particular receives compression hint signals that are generated by the monitored circuitry (or indeed by any other suitable circuitry within the data processing system) which are used to assist the compression scheme selection circuit in selecting the appropriate compression circuit at any particular point in time. As an example, the compression hints may be inserted by the monitored circuitry into the data elements output by the monitored circuitry, to identify changes in activity which might make a change in compression scheme appropriate. These compression hints may be used by the compression scheme selection circuit 250 to trigger a re-performance of the test period of operation, the compression scheme selection circuit 250 then using the results output by the various compression circuits in the manner discussed earlier with reference to FIG. 4 in order to determine which compression circuit to select. However, alternatively the compression hints may actively identify which compression scheme is considered appropriate for future trace packets, for example based on the monitored circuitry's understanding of what activities it is undertaking and hence the general pattern of activities that needs to be traced.

In addition to specific compression hints, the compression scheme selection circuitry 250 can also seek to analyse specific attributes of the activities of the monitored circuitry, for example by referencing some of the data elements output from the monitored circuitry. For example, the compression scheme selection circuitry 250 may monitor a "thread" identification register (also known as a "context" identification register) to determine the application that is running at any particular point in time, and based on that information perform some analysis as to whether a change in compression scheme is appropriate. As an example, the compression scheme selection circuit 250 may be provided with information indicating that a first compression scheme is applicable when a particular application is running, and a second compression scheme is appropriate when a different application is running, the compression scheme selection circuit 250 being able to determine from analysis of the thread identification register which application is running, and accordingly which compression scheme should be used. In some embodiments a similar analysis could be performed by analysing which memory addresses are being accessed in order to determine which application is running, for example when monitoring a processor designed for embedded control or running a Real Time Operating system (RTOS).

As with the embodiment of FIG. 4, the results of the compression scheme selection circuit 250 may be output directly to the relevant compression circuit and/or multiplexer 240, or instead may be stored in an encoding select field 255 provided within appropriate control registers 140.

Figure 6:
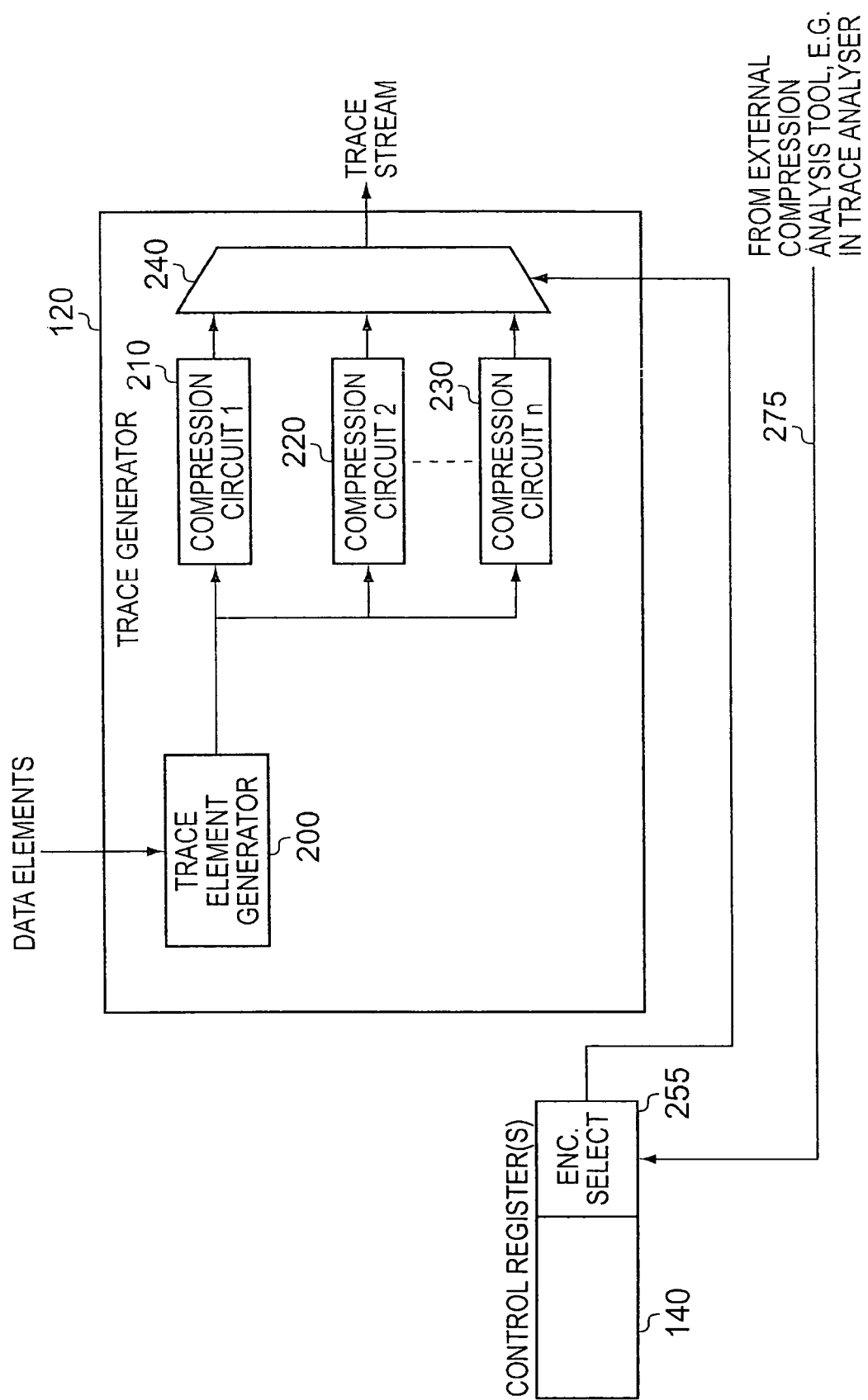
FIG. 6 is a block diagram illustrating the trace generator of FIG. 3 in accordance with a further alternative embodiment of the present invention.

FIG. 6 illustrates an alternative embodiment of trace generator where the compression analysis circuit 250 is omitted, and instead such compression analysis is performed externally offline. As an example, such compression analysis may be performed within the trace analyser tool based on the trace stream received over time from the trace generator 120 of the trace module 20. A select signal can then be generated and routed over path 275 to the encoding select field 255 to thereby control future selection of the compression circuits 210, 220, 230.

Whilst for ease of understanding, the various compression circuits shown in FIGS. 4 to 6 are shown as physically separate circuits, it will be appreciated that in some embodiments those circuits may share significant portions of logic with each other. In particular, whilst each compression circuit represents a different compression scheme that can be used, a number of the encoding formats provided within any particular compression scheme may be shared with other compression schemes. For example, in one embodiment, a first compression scheme may provide one or more encoding formats for p-headers which occupy an overlapping bit pattern encoding space to some different encoding formats provided for p-headers in a second compression scheme. However the other encoding formats used to encode other headers or payload portions associated with headers may be unchanged between the two compression schemes, and accordingly the compression circuits used to embody those two different compression schemes will actually share a significant proportion of logic with each other.

Figure 7:
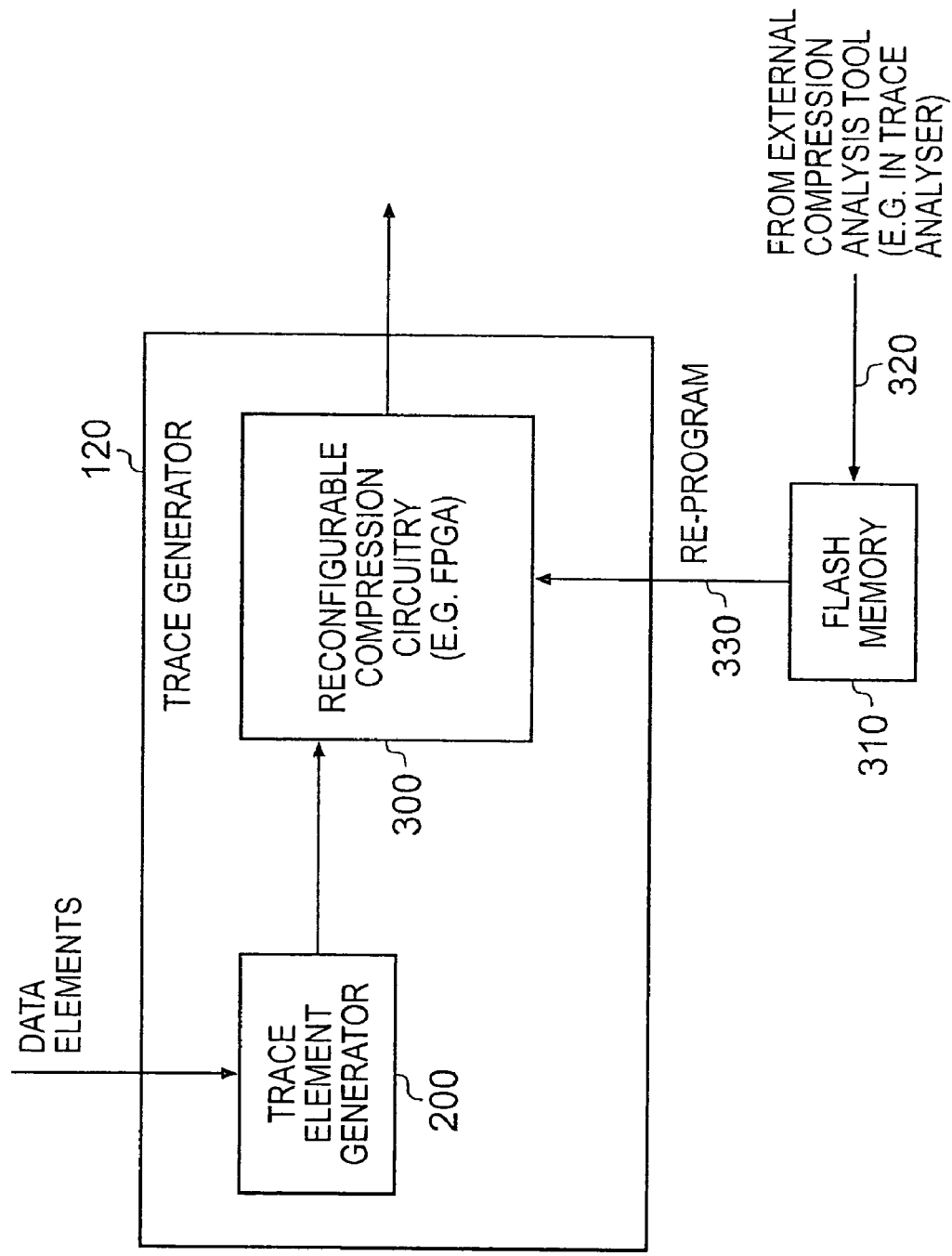
FIG. 7 is a block diagram illustrating the trace generator of FIG. 3 in accordance with a further alternative embodiment of the present invention.

FIG. 7 illustrates an alternative embodiment of trace generator 120 where instead of a predetermined number of compression circuits, and accordingly a predetermined number of possible compression schemes, reconfigurable compression circuitry 300 is provided, which in one embodiment may take the form of a field programmable gate array (FPGA) device. The reconfigurable compression circuitry 300 can be re-programmed over path 330 from compression scheme defining information stored within a memory device such as flash memory 310. That information will typically be produced by an external compression analysis tool used to analyse the trace stream produced by the trace generator 120 over a period of time, and based thereon develop a suitable compression scheme which will enable an improvement in efficiency of compression for future packets of the trace stream produced whilst the trace module is in the same trace mode of operation, assuming a similar pattern of trace elements occurs over time. Hence, in such embodiments, rather than merely selecting between a predetermined number of predetermined compression schemes, such an approach enables a more optimal compression scheme to be developed and for the reconfigurable compression circuitry to then be reprogrammed in accordance with that developed compression scheme.

Given the time that may be required to perform such analysis and to develop a particular compression scheme, it is typically expected that the analysis would be performed off-chip, for example in the trace analyser. However, in certain embodiments it may be possible for such analysis to still be performed on-chip within the trace generator 120 with the reconfigurable compression circuitry 300 then being re-programmed based on compression defining information generated internally.

Figure 8:
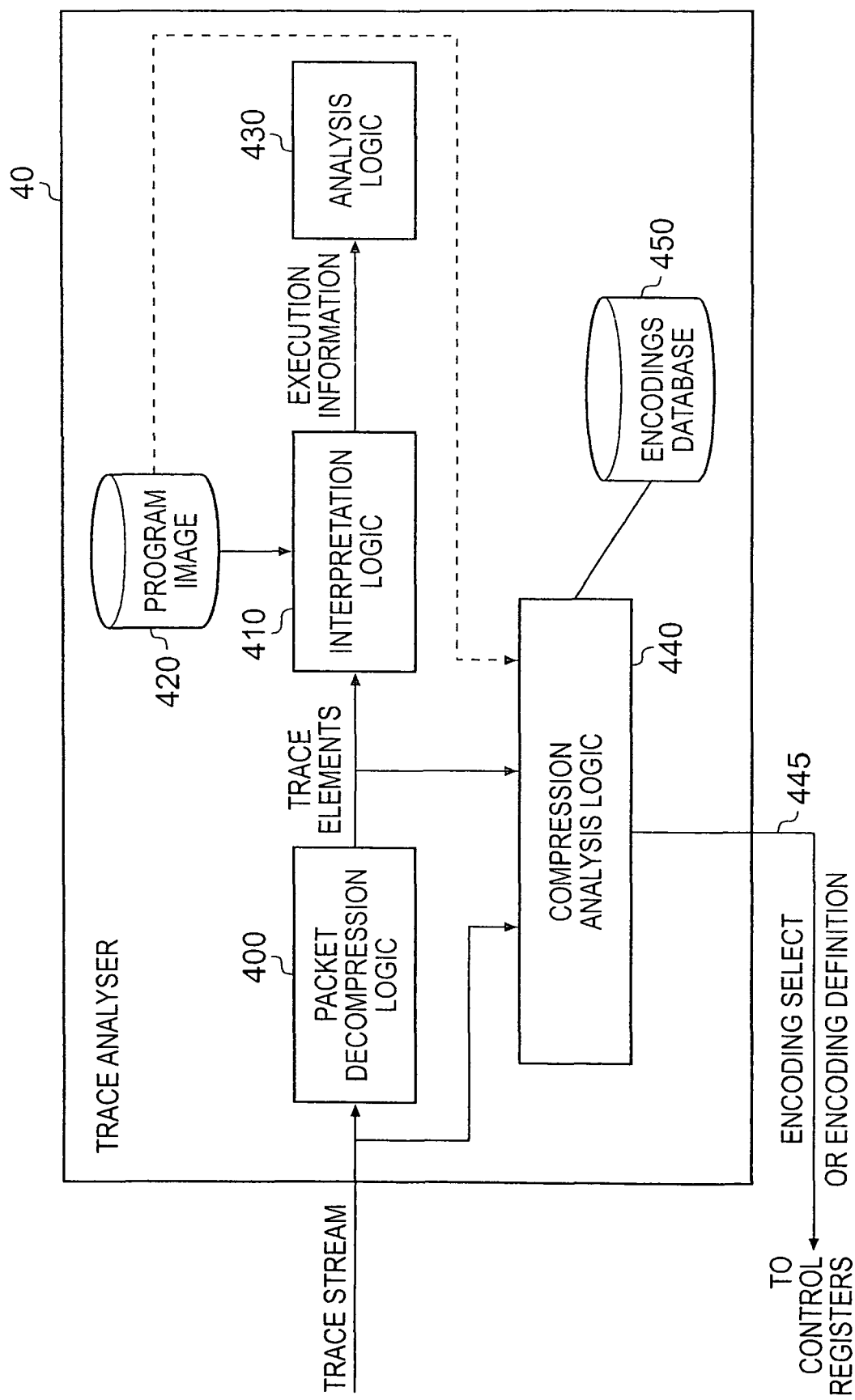
FIG. 8 is a diagram illustrating the trace analyser of FIG. 1 in accordance with one embodiment of the present invention.

FIG. 8 illustrates logic that may be provided within a trace analyser 40 in accordance with one embodiment of the present invention. Firstly, the trace stream is received by packet decompression logic 400, which based on an understanding of the compression scheme used to produce the trace stream packets then decompresses the packets into the constituent trace elements. Interpretation logic 410 then uses the trace elements to construct execution information about the activities being performed in the monitored circuitry as indicated by those trace elements. To perform such an analysis, the interpretation logic 410 typically references a program image 420 providing a copy of the program code executed by the monitored circuitry. The analysis 430 then performs any required further analysis, for example to facilitate debugging of sequences of processing instructions, for performing profiling operations in order to determine the performance of particular program code, etc. The components 400, 410, 420, 430 may be provided in a standard trace analyser tool 40.

In accordance with one embodiment of the present invention, the trace analyser tool 40 may additionally comprise compression analysis logic 440 to perform an analysis of the effectiveness of the compression being applied by the compression circuitry within the trace module 20. To perform this analysis, the compression analysis logic 440 receives the trace stream input to the trace analyser tool 40 along with the stream of trace elements as decompressed by the packet decompression logic 400. In one embodiment, the compression analysis logic 440 can then perform a variety of different compressions on the same sequence of trace elements using a number of known compression schemes identified in an encodings database 450, and based thereon determine whether any of those compression schemes would give a more efficient compression than the compression achieved in the trace stream received from the trace module 20. If so, one of those compression schemes can be selected, and an encoding select signal output over path 445 to control future compression within the trace generator 120 of the trace module 20. For example, that information may be routed to the encoding select field 255 of the control registers 140 to control which compression circuit is selected for future compression of the trace elements.

In an alternative embodiment, if the trace generator 120 includes reconfigurable compression circuitry 300, the compression analysis logic 440 may seek to derive a particular compression scheme which is aimed at providing more optimal compression based on an analysis of a certain subset of the trace elements decompressed by the packet decompression logic 400, with the definition of the determined compression scheme then being output over path 445 and used to re-program the reconfigurable compression circuitry of the trace generator 120.

However the compression analysis is performed, the compression analysis logic 440 can also have access to the program image 420 so that it can determine whether the portion of trace elements analysed would be representative of the general activities expected when the monitored circuitry is executing the code as set out in the program image. This may be used as a checkpoint for situations where the compression analysis logic 440 has determined that another compression scheme may be more appropriate, by ensuring that a check is made with reference to the program image to seek to determine whether such a change is likely to give rise to long term savings in compression efficiency.

Figure 9:
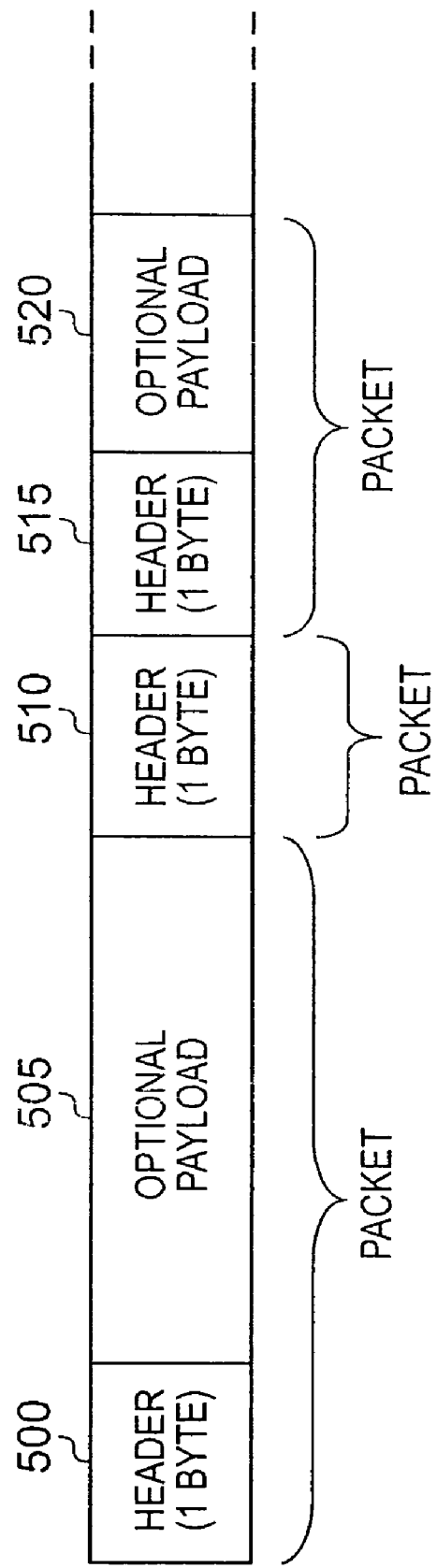
FIG. 9 is a diagram schematically illustrating the provision of packets in the trace stream produced by the trace module 20 of FIG. 1 in accordance with one embodiment of the present invention.

As mentioned previously, the trace generator 120 within the trace module 20 produces a trace stream consisting of a plurality of packets. FIG. 9 illustrates an example of a portion of such a trace stream, and serves to illustrate that packets may be of different sizes and contain different elements. Each packet in one embodiment contains a header 500, 510, 515, which in one particular embodiment consists of one byte of information. A packet may consist solely of a header, such as in the earlier-mentioned p-header example, where the header encodes a sequence of atoms produced to represent execution activities of the monitored circuitry, or alternatively may be followed by an optional payload portion 505, 520. The size of the payload portions may vary. In one embodiment, the size of the payload may depend on the type of information being traced, as determined by the content of the associated header portion. Alternatively, the payload size for a particular piece of trace information may be variable, with some sync information being provided in the trace stream to identify the length or end of any particular payload portion.

The compression formats provided within any particular compression scheme to deal with the headers and various optional payloads can take a variety of forms, but the various encoding formats provided within a particular compression scheme will be non-overlapping so that any particular block of data can be uniquely decoded by the trace analyser to identify the trace elements represented therein. Hence by way of example, whilst there are 256 possible encodings for a header consisting of one byte of data, only a portion of those encodings will be available for encoding p-headers, with other portions of that encoding space being used to encode other types of headers. To increase the number of encoding formats available within any particular compression scheme, it would be necessary to increase the overall size of available bit patterns, but this would increase the overall trace bandwidth.

Instead, in accordance with embodiments of the present invention, as discussed earlier, a mechanism is provided which enables the compression scheme applied for a particular trace mode of operation to be changed so that multiple compression schemes can be made available for use with a particular trace mode of operation, with each such compression scheme having a bit pattern encoding space which overlaps with the bit pattern encoding space of another of those compression schemes. At any particular point in time, only one of those compression schemes will be used and identified as the current compression scheme, but in response to a compression change stimulus the compression scheme can be switched to a different compression scheme, whereafter particular bit patterns appearing in the trace stream may have different meanings to the corresponding bit patterns appearing earlier in the trace stream in association with a different compression scheme.

Figure 10:
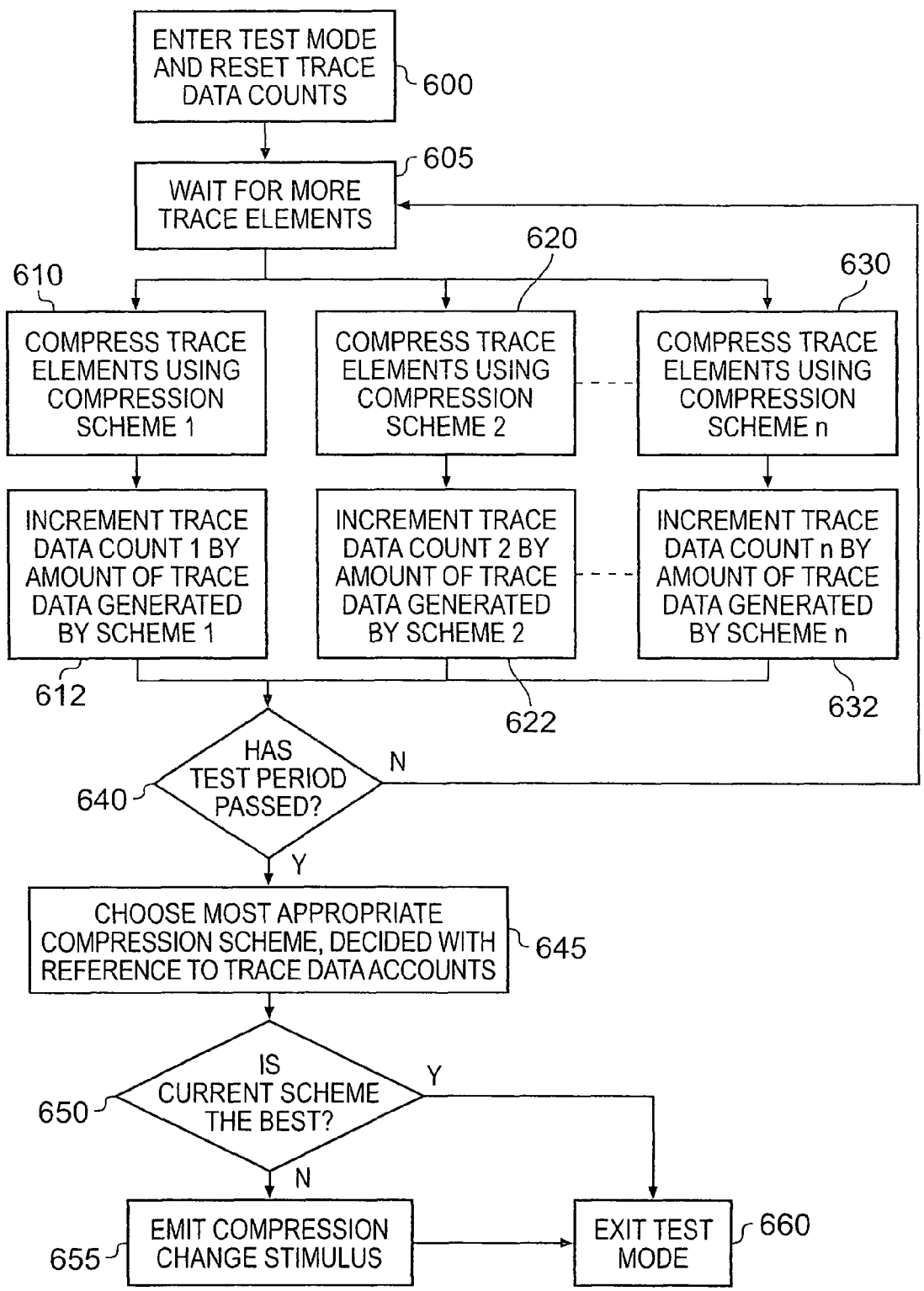
FIG. 10 is a flow diagram illustrating the operation of the compression circuits and compression analysis circuit of FIG. 4 in accordance with one embodiment of the present invention.

FIG. 10 is a flow diagram illustrating steps that may be performed within the compression circuits 210, 220, 230 and compression analysis circuit 250 of FIG. 4 in accordance with one embodiment of the present invention. At step 600, a test mode of the compression analysis circuit is entered at which point trace data counts kept for each compression circuit are reset. At step 605, the process awaits receipt of a sequence of trace elements from the trace element generator 200 whereafter at steps 610, 620, 630, each of the compression circuits 210, 220, 230 compresses that sequence of trace elements using the associated compression scheme. The results produced by each compression circuit are then forwarded to the compression analysis circuitry 250 which at steps 612, 622, 632 increments the relevant trace data: counts maintained for each compression circuit by the amount of trace data generated by those compression circuits. In the example of FIG. 10, it is assumed that each of the compression circuits is able to operate in parallel during this test mode of operation, but as mentioned earlier in an alternative embodiment each of the compression circuits may be utilised in turn for particular periods of time during which trace elements are produced. It will be appreciated that in this latter embodiment the compression analysis circuit can still maintain separate trace data counts for the various compression circuits.

At step 640 it is determined whether the test period has completed, and if not the process returns to step 605. However, once the test period has completed, then the compression analysis circuit 250 chooses at step 645 the most appropriate compression scheme with reference to the trace data count information maintained based on the outputs from the various compression circuits.

Thereafter, at step 650, it is determined whether the currently selected compression scheme, i.e. the one that is being used to produce the packets actually output in the trace stream, is the scheme selected at step 645 as the most appropriate scheme. If so, no further action is needed and the test mode exits at step 660. However, if the current scheme is not the best scheme, then at step 655 compression change stimulus is emitted, in the example of FIG. 4 this taking the form of a select signal stored in the encoding select field 255 of the control registers 140 to control which compression circuit is used to produce subsequent packets for inclusion in the trace stream.

Figure 11:
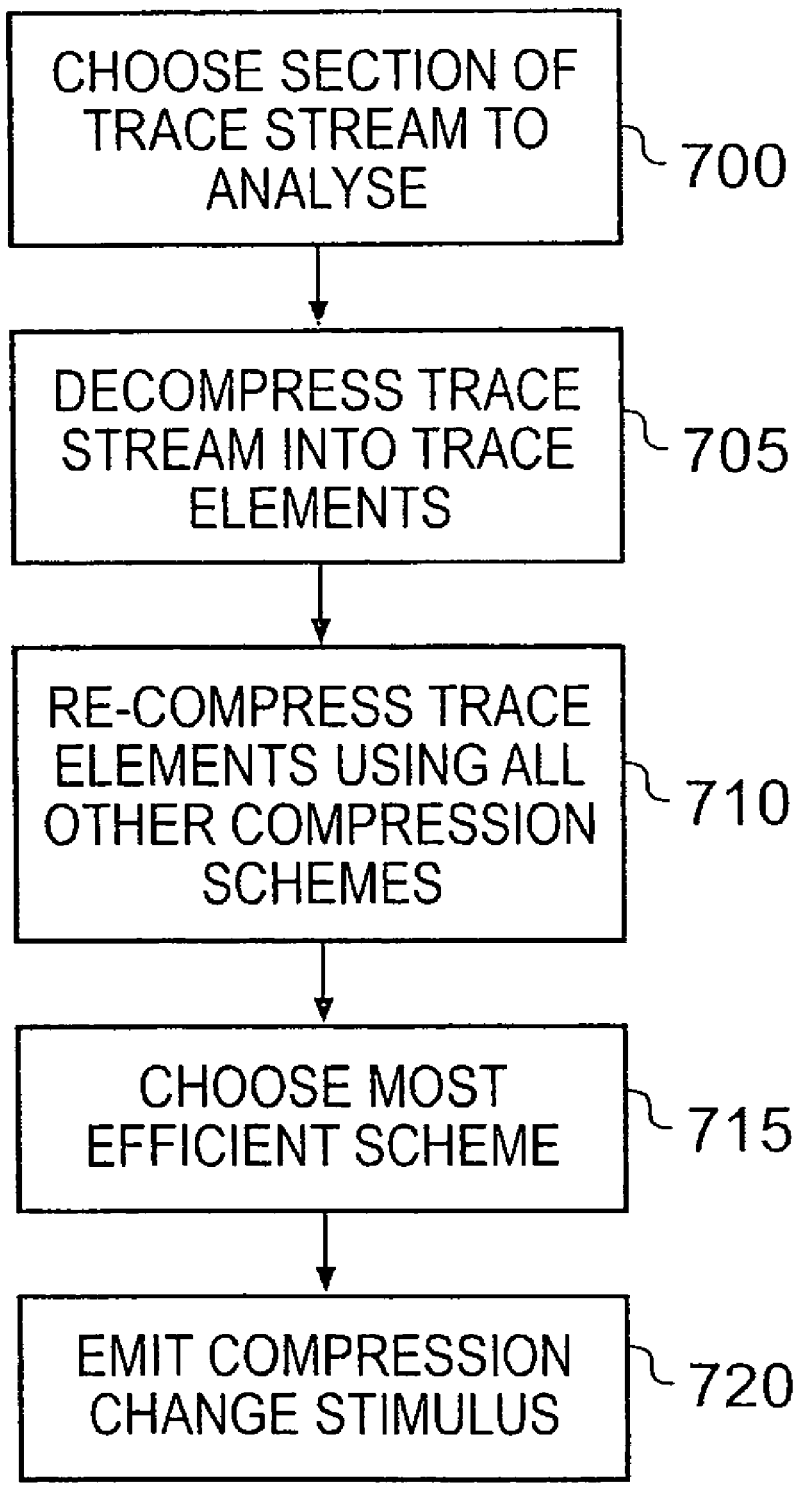
FIGS. 11 and 12 are flow diagrams illustrating the operation of the packet decompression logic and compression analysis logic of the trace analyser of FIG. 8 in accordance with two alternative embodiments of the present invention.

FIG. 11 is a flow diagram illustrating a sequence of steps that may be performed by the packet decompression logic 400 and compression analysis logic 440 of the trace analyser 40 shown in FIG. 8 in accordance with one embodiment of the present invention. At step 700, a section of the trace stream is chosen to be analysed, whereafter at step 705 the packet decompression logic 400 is used to decompress the trace stream into the relevant trace elements. Thereafter, at step 710 those trace elements are re-compressed using all of the other available compression schemes as identified in the encodings database 450. Thereafter, at step 715 the most efficient scheme is chosen based on the scheme producing the least amount of trace data for the provided trace elements. Thereafter, at step 720 the compression change stimulus is emitted over path 445, and in this embodiment may take the form of a select signal routed to the encoding select field 255 of the control registers 140, as for example shown earlier in FIG. 6.

Figure 12:
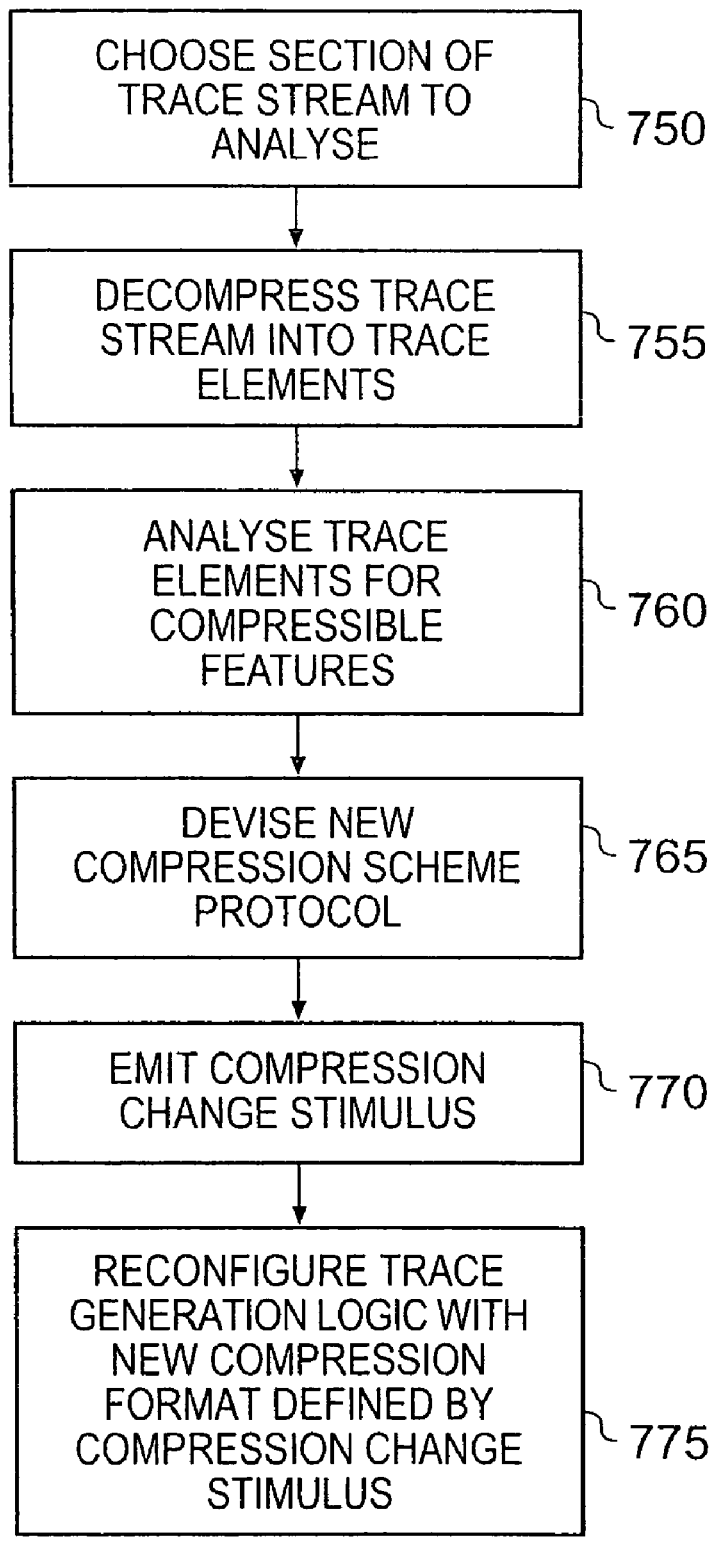

FIG. 12 illustrates an alternative sequence of steps that may be performed by the packet decompression logic 400 and compression analysis logic 440 in accordance with an alternative embodiment of the present invention. At step 750, a section of the trace stream is chosen to analyse, whereafter at step 755 that portion is decompressed using the packet decompression logic 400 to identify the relevant trace elements. Thereafter, at step 760 the trace elements are analysed to identify compressible features. This for example may involve identifying a sequence of trace elements of the same form which could be compressed by run length encoding, or other known techniques for identifying suitable features for compression.

Thereafter, at step 765, a new compression scheme is devised based on the compressible features identified at step 760, whereafter at step 770 compression change stimulus is emitted. In this situation the compression change stimulus will need to define the new compression scheme.

Such an embodiment may be used in situations where the compression circuitry within the trace module 20 is able to be reconfigured. For example, if the compression circuitry comprises an FPGA device, it would be possible to reprogram the FPGA based on the compression change stimulus. Accordingly, at step 775, the trace generation circuitry is reconfigured based on the compression change stimulus so that it will subsequently perform compression in accordance with the newly identified compression scheme.

Figure 13:
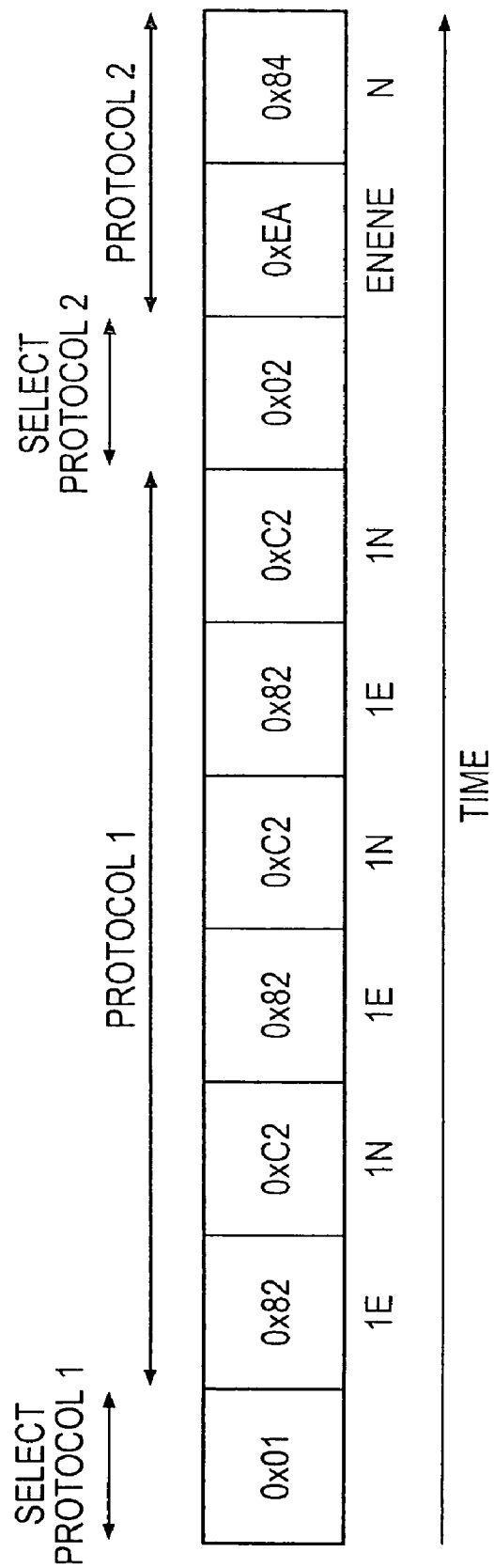
FIG. 13 is a diagram schematically illustrating the efficiencies in compression that can be achieved when switching compression scheme.

FIG. 13 is a diagram schematically illustrating the enhancement in compression efficiency that can be achieved when providing the mechanism of embodiments of the present invention to enable a change in compression scheme whilst still in the same trace mode of operation. FIG. 13 is based on the following considerations.

Consider two byte encoded protocols as follows:
Protocol 1:
Format 1: 10EEEEE0 (encodes 0-31 E atoms in sequence)
Format 2: 11NNNNN0 (encodes 0-31 N atoms in sequence)
Protocol 2:
Format 1: 11FFFFF0 (encodes 5 atoms, each one being an E or an N atom)
Format 2: 101FFFF0 (encodes 4 atoms, each one being an E or an N atom)
Format 3: 1001FFF0 (encodes 3 atoms, each one being an E or an N atom)
Format 4: 10001FF0 (encodes 2 atoms, each one being an E or an N atom)
Format 5: 100001F0 (encodes 1 atom, which can be an E or an N atom)

If it is required to encode the stream of atoms ENENEN, then using protocol 1 this requires 6 bytes of trace whereas if the compression scheme is switched to protocol 2 it only requires 2 bytes of trace, along with a change-message 0PPPPPPP, where P encodes the number of the protocol selected.

In particular, as can be seen in FIG. 13, using protocol 1 each E or N atom needs to be encoded by a separate byte, since protocol 1 has two different encoding formats which have been designed to optimise compression for long sequences of E or N atoms, since the bit positions denoted with an "E" in format 1 can be used to specify the number of E atoms appearing one after the other in a sequence, and similarly using format 2 the bit positions denoted with a N can be used to identify the number of N atoms appearing in a particular sequence. Hence, protocol 1 is ill suited for compressing individual E atoms followed by individual N atoms. In contrast, protocol 2 can encode sequences of one, two, three, four or five atoms of either type, since each bit position identified by a F can be used to identify either an E atom (by setting the bit position to one) or an N atom (by setting the bit position to zero).

Hence format 1 of protocol 1 can be used to encode via a single byte a sequence of between 0 and 31 E atoms, and similarly format 2 of protocol 1 can be used to encode via a single byte a sequence of between 0 and 31 N atoms. Whilst this can give significant compression efficiencies when encoding large sequences of E or N atoms, it clearly is not very efficient for the particular sequence of atoms discussed above where each E atom is followed by an N atom, and instead it would be better to select compression protocol 2 via the protocol switch byte 0x02 shown in FIG. 13, assuming that similar sequences were expected to occur for a sufficient period of time to make the switch worthwhile.

Figure 14:
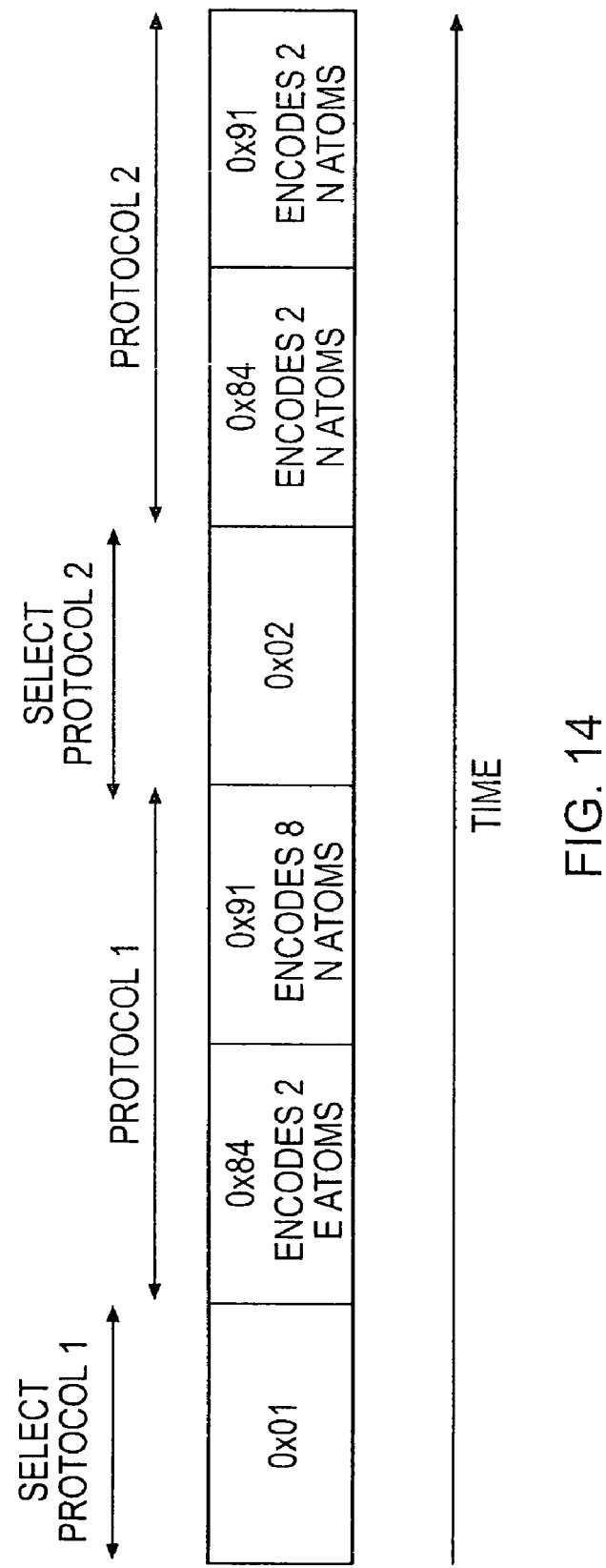
FIG. 14 illustrates how a particular bit pattern is interpreted differently in accordance with different compression schemes used in accordance with one embodiment of the present invention.

FIG. 14 is a diagram that illustrates how in different portions in a trace stream, the same bit patterns can mean different things dependent on the compression scheme. FIG. 14 is based on the following considerations.

Consider two byte encoded protocols as follows:
Protocol 1:
Format 1: 1EBBEEE0 (encodes 0-63 E atoms in sequence)
Format 2: 1NNNNNN1 (encodes 0-63 N atoms in sequence
Protocol 2:
Format 1: 1EEEENN0 (encodes 0-15 E atoms, followed by 0 to 3 N atoms)
Format 2: 1NNNNEE1 (encodes 0-15 N atoms, followed by 0 to 3 E atoms)
and a change message 0PPPPPPP, where P encodes the number of the protocol selected.

Hence, following selection of protocol 1 via the change message 0x01 appearing in the trace stream, the following two bytes of information shown in FIG. 14 can be used to encode two E atoms followed by eight N atoms. If for some reason it was determined at this point that a change in compression scheme was appropriate, and in particular compression protocol 2 was to be selected as identified by the change message 0x02, then it can be seen that the following two bytes may actually have exactly the same two bit patterns as the two bytes used when employing protocol 1, but now encode two N atoms followed by another two N atoms, the first byte using format 1 and the second byte using format 2 of protocol 2.

As will be appreciated from the above discussion of embodiments of the present invention, such embodiments enable a change in compression scheme to take place whilst still in a particular trace mode of operation. There are a variety of ways in which such a change can be brought about. In one embodiment, the trace circuitry can dynamically adapt the compression scheme to one of a chosen set. To do this, it may either compare multiple techniques simultaneously, choosing the one that is perceived to provide the best compression, or alternatively over a small test segment may try multiple different techniques and then settle on the one perceived to provide the best compression. As discussed above, in an alternative embodiment the trace analysing tool can be used to analyse the trace output and determine the best compression technique, and then generate a select signal used to switch the compression scheme applied by the trace circuitry. Alternatively, the trace analysing tool can analyse the trace output and determine a more optimal compression scheme and then re-program configurable compression circuitry within the trace circuitry so as to then employ that compression scheme for future packets generated by the trace circuitry.

In one embodiment, the trace circuitry can be arranged to indicate which compression scheme is being used by inclusion of a change compression byte within the trace stream so that the logic responsible for decompressing the trace stream can dynamically adapt to the new compression scheme. Such an approach is particularly beneficial in situations where the trace analysing tool performing the decompression is not directly in control of when a change in compression scheme takes place.

Since in accordance with embodiments of the present invention multiple meanings can be overlaid on the same bit patterns, the overall size of the bit patterns can be made significantly smaller than if all of those meanings were to be supported in one compression protocol, and hence this significantly reduces the overall trace bandwidth over and above the reductions achieved directly by the use of the different compression schemes. By achieving a lower bandwidth of trace information, this can give rise to a requirement for less on-chip storage, less off-chip storage, and fewer pins for transmitting trace off-chip.

Whilst in the above description of embodiments of the present invention, the examples have concentrated on compression of p-headers, the concept of embodiments of the present invention can also be applied to any other areas of trace compression such as compression of data values and addresses and other packet formats.

In addition to performing analysis of different compression schemes, other mechanisms can be used to steer the selection of compression schemes in accordance with embodiments of the present invention. For example, as mentioned earlier, the program code could be instrumented to hint to the trace circuitry what compression scheme should be used, based on the code that is known to follow. Such hints could for example be inserted into the code by a compiler.

Furthermore, in some embodiments, the above-mentioned compression scheme switching mechanisms could be used to coarsely turn off some compression techniques. For some compression techniques the time and space complexity of the decompression algorithm may be such that it is not feasible to integrate hardware based decompression or to integrate a processor which can perform a sufficient number of operations to execute the algorithm in software to meet the performance requirements of the system. The compression scheme switching mechanism could be used to coarsely disable some compression techniques in order to reduce the time complexity or the space complexity or the decompression algorithm. Hence, for example, if there is some self-diagnostic software provided on-chip with the trace module which is used to decode trace captured on-chip, but the processor on-chip is not powerful enough to do the decoding in sufficient time, then compression could be disabled in order to facilitate the on-chip software performing the necessary decoding. Such a mechanism equally applies to on-chip hardware which might be used to decode the trace, for example for checksum purposes, or for real-time trace analysis.

Although a particular embodiment has been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. Trace circuitry provided on a chip for generating a trace stream of packets to be output from the chip, the trace stream indicating activities of monitored circuitry within the chip, the monitored circuitry producing data elements indicative of said activities, and the trace circuitry comprising:
   trace element generation circuitry responsive to at least some of the data elements produced by the monitored circuitry to generate trace elements representative of those at least some of the data elements, the trace elements generated being dependent on a selected trace mode of operation of the trace circuitry; and
   compression circuitry for applying an encoding operation to a sequence of trace elements to produce a packet whose bit pattern represents the sequence of trace elements, and to cause that packet to be output in the trace stream, the encoding operation applied being dependent on a current compression scheme associated with the compression circuitry;
   the compression circuitry, whilst in the selected trace mode of operation, is responsive to a compression change stimulus to change the current compression scheme from a first compression scheme to a second compression scheme whose bit pattern encoding space overlaps the bit pattern encoding space of the first compression scheme, such that following the change of compression scheme any further packets produced whilst in said selected trace mode of operation are produced in accordance with the second compression scheme;
   wherein when the current compression scheme is changed, the compression circuitry is arranged to output a change signal in the trace stream to indicate that the change has been made, so that a trace analysing apparatus used to analyse the trace stream can determine when the compression scheme has changed so as to correctly interpret the packets in the trace stream despite the bit pattern encoding space of the first compression scheme and the second compression scheme overlapping.

2. Trace circuitry as claimed in claim 1, further comprising:
   compression scheme select circuitry for applying predetermined criteria to determine when to change the current compression scheme and upon said determination to cause the compression change stimulus to be produced.

3. Trace circuitry as claimed in claim 2, wherein:
   said compression circuitry comprises a plurality of compression elements, each compression element implementing a different compression scheme and being capable of performing said encoding operation;
   said compression scheme select circuitry is arranged to produce a select signal to select one of said compression elements as the compression element whose compression scheme is the current compression scheme, such that that selected compression element produces packets for inclusion in the trace stream; and
   the compression scheme select circuitry being arranged to generate said compression change stimulus by altering the select signal.

4. Trace circuitry as claimed in claim 3, wherein during at least a test period of operation each of the compression elements is arranged to perform the encoding operation with the produced packets being received by the compression scheme select circuitry, the compression scheme select circuitry performing an analysis operation on the produced packets to determine which of said compression elements to select via the select signal.

5. Trace circuitry as claimed in claim 2, wherein the monitored circuitry outputs hint signals, and those hint signals are routed to the compression scheme select circuitry for reference when determining whether to change the current compression scheme.

6. Trace circuitry as claimed in claim 2, wherein the compression scheme select circuitry is responsive to one or more attributes of the activities of the monitored circuitry when determining whether to change the current compression scheme.

7. Trace circuitry as claimed in claim 6, wherein one of said one or more attributes is a value held in a thread identification register indicating a current thread of execution within the monitored circuitry.

8. Trace circuitry as claimed in claim 1, further comprising:
a control register having a compression specifying field for storing the compression change stimulus, the compression circuitry referencing the compression specifying field of the control register to determine when to change the current compression scheme.

9. A trace analysing apparatus for analysing a trace stream generated by trace circuitry as claimed in claim 1, comprising:
packet decompression logic for decoding the packets in the trace stream in order to determine the sequence of trace elements represented by each said packet; and
compression scheme select logic for receiving the trace stream and the trace elements determined by the packet decompression logic and applying predetermined criteria to determine when to change the current compression scheme and upon said determination to produce the compression change stimulus.

10. A trace analysing apparatus as claimed in claim 9, wherein:
said compression circuitry of the trace logic supports a predetermined number of compression schemes;
said compression scheme select logic is arranged to produce a select signal to identify which compression scheme is the current compression scheme; and
said compression scheme select logic is arranged to generate said compression change stimulus by altering the select signal.

11. A trace analysing apparatus as claimed in claim 9, wherein the compression change stimulus includes information defining the second compression scheme to be used as the current compression scheme.

12. A trace analysing apparatus as claimed in claim 9, wherein the compression scheme select logic references a program image when applying said predetermined criteria to determine whether to change the current compression scheme.

13. Trace circuitry for generating a trace stream indicative of activities of monitored circuitry of a data processing apparatus, the monitored circuitry producing data elements indicative of said activities, and the trace circuitry comprising:
trace element generation circuitry responsive to at least some of the data elements produced by the monitored circuitry to generate trace elements representative of those at least some of the data elements, the trace elements generated being dependent on a selected trace mode of operation of the trace circuitry; and
compression circuitry for applying an encoding operation to a sequence of trace elements to produce a packet whose bit pattern represents the sequence of trace elements, and to cause that packet to be output in the trace stream, the encoding operation applied being dependent on a current compression scheme associated with the compression circuitry; whilst in the selected trace mode of operation, the compression circuitry being responsive to a compression change stimulus to change the current compression scheme from a first compression scheme to a second compression scheme whose bit pattern encoding space overlaps the bit pattern encoding space of the first compression scheme, such that following the change of compression scheme any further packets produced whilst in said selected trace mode of operation are produced in accordance with the second compression scheme, wherein the compression circuitry is a reconfigurable circuit, and the compression change stimulus when issued comprises information used to reconfigure the reconfigurable circuit so as to implement the second compression scheme.

14. Trace circuitry as claimed in claim 13, wherein the compression circuitry comprises duplicate reconfigurable circuits, such that one of the reconfigurable circuits configured to implement the first compression scheme is arranged to continue operation following receipt of the compression change stimulus whilst the other of the reconfigurable circuits is reconfigured in accordance with the compression change stimulus, following such reconfiguration the other of the reconfigurable circuits then being used to produce subsequent packets in accordance with the second compression scheme.

15. Trace circuitry as claimed in claim 13, wherein the reconfigurable circuit is a programmable logic device and the compression change stimulus is stored in a memory device used to reprogram the programmable logic device.

16. Trace circuitry for generating a trace stream indicative of activities of monitored circuitry of a data processing apparatus, the monitored circuitry producing data elements indicative of said activities, and the trace circuitry comprising:
trace element generation circuitry responsive to at least some of the data elements produced by the monitored circuitry to generate trace elements representative of those at least some of the data elements, the trace elements generated being dependent on a selected trace mode of operation of the trace circuitry;
compression circuitry for applying an encoding operation to a sequence of trace elements to produce a packet whose bit pattern represents the sequence of trace elements, and to cause that packet to be output in the trace stream, the encoding operation applied being dependent on a current compression scheme associated with the compression circuitry, whilst in the selected trace mode of operation, the compression circuitry being responsive to a compression change stimulus to change the current compression scheme from a first compression scheme to a second compression scheme whose bit pattern encoding space overlaps the bit pattern encoding space of the first compression scheme, such that following the change of compression scheme any further packets produced whilst in said selected trace mode of operation are produced in accordance with the second compression scheme; and
a compression scheme select circuitry for applying predetermined criteria to determine when to change the current compression scheme and upon said determination to cause the compression change stimulus to be produced, wherein the compression scheme select circuitry is responsive to one or more attributes of the activities of the monitored circuitry when determining whether to change the current compression scheme, wherein one of said one or more attributes is memory address regions being accessed by the monitored circuitry.

17. A data processing apparatus comprising:
monitored circuitry for producing data elements indicative of activities of the monitored circuitry; and
trace circuitry as claimed in claim 1 for generating a trace stream indicative of said activities of the monitored circuitry.

18. A method of changing a compression scheme applied by trace circuitry provided on a chip to generate a trace stream of packets to be output from the chip, said trace stream indicating activities of monitored circuitry within the chip, the monitored circuitry producing data elements indicative of said activities, and the method comprising the steps of:
responsive to at least some of the data elements produced by the monitored circuitry, generating trace elements representative of those at least some of the data elements, the trace elements generated being dependent on a selected trace mode of operation of the trace circuitry;
applying an encoding operation to a sequence of trace elements to produce a packet whose bit pattern represents the sequence of trace elements, and outputting that packet in the trace stream, the encoding operation applied being dependent on a current compression scheme;
changing, in response to a compression change stimulus whilst in the selected trace mode of operation, the current compression scheme from a first compression scheme to a second compression scheme whose bit pattern encoding space overlaps the bit pattern encoding space of the first compression scheme, such that following the change of compression scheme any further packets produced whilst in said selected trace mode of operation are produced in accordance with the second compression scheme; and
outputting, when the current compression scheme is changed, a change signal in the trace stream to indicate that the change has been made, so that a trace analysing apparatus used to analyse the trace stream can determine when the compression scheme has changed so as to correctly interpret the packets in the trace stream despite the bit pattern encoding space of the first compression scheme and the second compression scheme overlapping.

19. A computer program product embodied on a non-transitory computer readable storage medium and comprising a computer program for causing a computer to analyse a stream of trace elements generated by the method of claim 18 by performing the steps of:
decoding the packets in the trace stream in order to determine the sequence of trace elements represented by each said packet; and
applying, with reference to the trace stream and the trace elements decoded from the packets of the trace stream, predetermined criteria to determine when to change the current compression scheme and upon said determination to produce the compression change stimulus.

* * * * *